US007120729B2

(12) United States Patent
Gonzalez et al.

(10) Patent No.: US 7,120,729 B2
(45) Date of Patent: Oct. 10, 2006

(54) AUTOMATED WEAR LEVELING IN NON-VOLATILE STORAGE SYSTEMS

(75) Inventors: Carlos J. Gonzalez, Los Gatos, CA (US); Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 277 days.

(21) Appl. No.: 10/686,399

(22) Filed: Oct. 14, 2003

(65) Prior Publication Data

US 2004/0083335 A1 Apr. 29, 2004

Related U.S. Application Data

(60) Provisional application No. 60/422,173, filed on Oct. 28, 2002.

(51) Int. Cl.
*G06F 12/00* (2006.01)
*G06F 13/00* (2006.01)

(52) U.S. Cl. ............... 711/103; 711/165; 711/202; 365/218

(58) Field of Classification Search ........... 711/100, 711/103, 154, 159, 165, 200, 202; 365/185.29, 365/185.33, 218
See application file for complete search history.

(56) References Cited

U.S. PATENT DOCUMENTS

| 4,093,985 A | 6/1978 | Das |
| 4,430,727 A | 2/1984 | Moore et al. |
| 4,528,683 A | 7/1985 | Henry |
| 4,530,054 A | 7/1985 | Hamstra et al. |
| 4,562,532 A | 12/1985 | Nishizawa et al. |
| 4,563,752 A | 1/1986 | Pelgrom et al. |
| 4,608,671 A | 8/1986 | Shimizu et al. |
| 4,612,640 A | 9/1986 | Mehrotra et al. |
| 4,616,311 A | 10/1986 | Sato |
| 4,638,457 A | 1/1987 | Schrenk |
| 4,663,770 A | 5/1987 | Murray et al. |
| 4,682,287 A | 7/1987 | Mizuno et al. |
| 4,718,041 A | 1/1988 | Baglee et al. |
| 4,803,707 A | 2/1989 | Cordan, Jr. |
| 4,899,272 A | 2/1990 | Fung et al. |

(Continued)

FOREIGN PATENT DOCUMENTS

DE 2840305 3/1980

(Continued)

OTHER PUBLICATIONS

EPO/ISA, "Communication Pursuant to Article 96(2) EPC", Office Action mailed in related application No. 03 774 734.2—2210 on Jul. 9, 2005, 3 pages.

(Continued)

*Primary Examiner*—Tuan V. Thai
(74) *Attorney, Agent, or Firm*—Parsons Hsue & de Runtz LLP

(57) ABSTRACT

Methods and apparatus for performing wear leveling in a non-volatile memory system are disclosed. Included is a method for performing wear leveling in a memory system that includes a first zone, which has a first memory element that includes contents, and a second zone includes identifying the first memory element and associating the contents of the first memory element with the second zone while disassociating the contents of the first memory element from the first zone. In one embodiment, associating the contents of the first memory element with the second involves moving contents of a second memory element into a third memory element, then copying the contents of the first memory element into the second memory element.

28 Claims, 11 Drawing Sheets

U.S. PATENT DOCUMENTS

| | | | |
|---|---|---|---|
| 4,922,456 A | 5/1990 | Naddor et al. | |
| 4,924,375 A | 5/1990 | Fung et al. | |
| 4,943,962 A | 7/1990 | Imamiya et al. | |
| 4,947,410 A | 8/1990 | Lippmann et al. | |
| 4,953,073 A | 8/1990 | Moussouris et al. | |
| 5,034,926 A | 7/1991 | Taura et al. | |
| 5,043,940 A | 8/1991 | Harari | |
| 5,053,990 A | 10/1991 | Kreifels et al. | |
| 5,065,364 A | 11/1991 | Atwood et al. | |
| 5,095,344 A | 3/1992 | Harari | |
| 5,103,411 A | 4/1992 | Shida et al. | |
| 5,134,589 A | 7/1992 | Hamano | |
| 5,138,580 A | 8/1992 | Farrugia et al. | |
| 5,155,705 A | 10/1992 | Goto et al. | |
| 5,163,021 A | 11/1992 | Mehrotra et al. | |
| 5,168,465 A | 12/1992 | Harari | |
| 5,172,338 A | 12/1992 | Mehrotra et al. | |
| 5,193,071 A | 3/1993 | Umina et al. | |
| 5,210,716 A | 5/1993 | Takada | |
| 5,222,109 A | 6/1993 | Pricer | |
| 5,245,572 A | 9/1993 | Kosonocky et al. | |
| 5,263,003 A | 11/1993 | Cowles et al. | |
| 5,267,218 A | 11/1993 | Elbert | |
| 5,268,870 A | 12/1993 | Harari | |
| 5,270,979 A | 12/1993 | Harari et al. | |
| 5,272,669 A | 12/1993 | Samachisa et al. | |
| 5,280,447 A | 1/1994 | Hazen et al. | |
| 5,295,255 A | 3/1994 | Malecek et al. | |
| 5,297,148 A | 3/1994 | Harari et al. | |
| 5,303,198 A | 4/1994 | Adachi et al. | |
| 5,341,489 A | 8/1994 | Heiburger et al. | |
| 5,357,473 A | 10/1994 | Mizuno et al. | |
| 5,371,876 A | 12/1994 | Ewertz et al. | |
| 5,388,083 A | 2/1995 | Assar et al. | |
| 5,430,859 A | 7/1995 | Norman et al. | |
| 5,544,118 A | 8/1996 | Harari | |
| 5,548,554 A | 8/1996 | Pascucci et al. | |
| 5,572,466 A * | 11/1996 | Sukegawa | 365/185.33 |
| 5,630,093 A | 5/1997 | Holzhammer et al. | |
| 5,663,901 A | 9/1997 | Wallace et al. | |
| 5,726,937 A | 3/1998 | Beard | |
| 5,890,192 A | 3/1999 | Lee et al. | |
| 5,912,848 A * | 6/1999 | Bothwell | 365/195 |
| 5,930,167 A | 7/1999 | Lee et al. | |
| 5,963,474 A * | 10/1999 | Uno et al. | 365/185.04 |
| 6,000,006 A * | 12/1999 | Bruce et al. | 711/103 |
| 6,034,897 A * | 3/2000 | Estakhri et al. | 365/185.33 |
| 6,081,447 A * | 6/2000 | Lofgren et al. | 365/185.02 |
| 6,141,251 A * | 10/2000 | Xing | 365/185.11 |
| 6,149,316 A | 11/2000 | Harari et al. | |
| 6,167,483 A * | 12/2000 | Miyauchi | 711/103 |
| 6,230,233 B1 * | 5/2001 | Lofgren et al. | 711/103 |
| 6,381,176 B1 * | 4/2002 | Kim et al. | 365/185.11 |
| 6,594,183 B1 | 7/2003 | Lofgren et al. | |
| 6,675,281 B1 * | 1/2004 | Oh et al. | 711/207 |
| 2002/0099904 A1 | 7/2002 | Conley | |

FOREIGN PATENT DOCUMENTS

| | | |
|---|---|---|
| DE | 3200872 | 7/1983 |
| DE | 19718479 C1 | 9/1998 |
| EP | 0349775 | 1/1990 |
| EP | 0392895 | 10/1990 |
| EP | 0398654 | 11/1990 |
| EP | 0424191 | 4/1991 |
| EP | 0492106 | 7/1992 |
| EP | 0522780 | 1/1993 |
| EP | 0569040 | 5/1993 |
| EP | 0544252 A2 | 6/1993 |
| EP | 0615193 | 9/1994 |
| GB | 02251323 | 7/1992 |
| GB | 02251324 | 7/1992 |
| JP | 58-215794 | 12/1983 |
| JP | 58-215795 | 12/1983 |
| JP | 59-045695 | 3/1984 |
| JP | 59-162695 | 9/1984 |
| JP | 60-179857 | 9/1985 |
| JP | 62-283496 | 12/1987 |
| JP | 62-283497 | 12/1987 |
| JP | 63-183700 | 7/1988 |
| JP | 1235075 | 9/1989 |
| JP | 2189790 | 7/1990 |
| JP | 2292798 | 12/1990 |
| JP | 3025798 | 2/1991 |
| JP | 3030034 | 2/1991 |
| JP | 3283094 | 12/1991 |
| JP | 4243096 | 1/1992 |
| JP | 4123243 | 4/1992 |
| JP | 5027924 | 2/1993 |
| JP | 5028039 | 2/1993 |
| JP | 5204561 | 8/1993 |
| JP | 5241741 | 9/1993 |
| WO | WO 9218928 | 10/1992 |
| WO | WO 9311491 | 6/1993 |
| WO | WO 9427382 | 11/1994 |

OTHER PUBLICATIONS

Torelli et al., "An Improved Method for Programming a Word-Erasable EEPROM," Alta Fequenza, vol. 52, Nov. 1983, pp. 487-494.

Lahti et al., "Store Data in a Flash," BYTE, Nov. 1990, pp. 311-313, 315, 317-318.

Leibson, Steven H., "Nonvolatile, In-Circuit-Reprogrammable Memories," EDN Special Report, Jan. 3, 1991, pp. 89-97, 100, 102.

Nozaki et al., "A 1-Mb EEPROM with MONOS Memory Cell for Semiconductor Disk Application," IEEE Journal of Solid State Circuits, vol. 26, No. 4, Apr. 1991, pp. 497-501.

Auclair, Daniel, "Optimal Solid State Disk Architecture for Portable Computers", SunDisk, Presented at the Silicon Valley PC Design Conference, Jul. 9, 1991, pp. 1-4.

Hwang et al., "Computer Architecture and Parallel Processing," McGraw-Hill, 1984, p. 64.

Williams, John G., "Asymmetric Memory Hierarchies," Communications for the Association for Computing Machinery, vol. 16, No. 4, Apr. 1973, pp. 213-222.

Computer Technology Review, "Flash Memory for Top Speeds in Mobile Computing," vol. 12, No. 7, Jun. 1992, pp. 36-37.

Boxer, Aaron, "Where Buses Cannot Go," IEEE Spectrum, Feb. 1995, pp. 41-45.

European Patent Office, Communication, mailed in related European Patent Application No. 03774734.2 on Mar. 22, 2006, 1 page.

"Notification of Transmittal of the International Search Report or the Declaration", corresponding PCT application No. PCT/US01/30342, International Searching Authority, European Patent Office, Sep. 10, 2003, 7 pages.

* cited by examiner

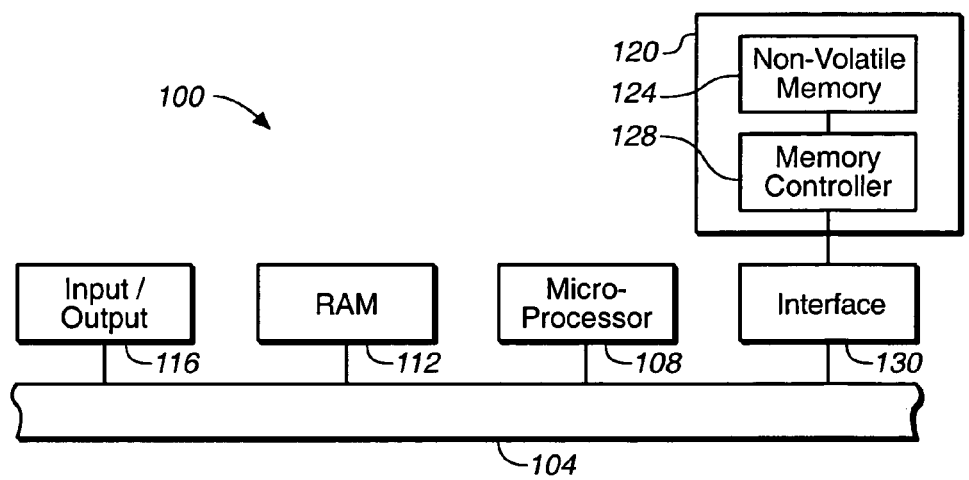
FIG._1a
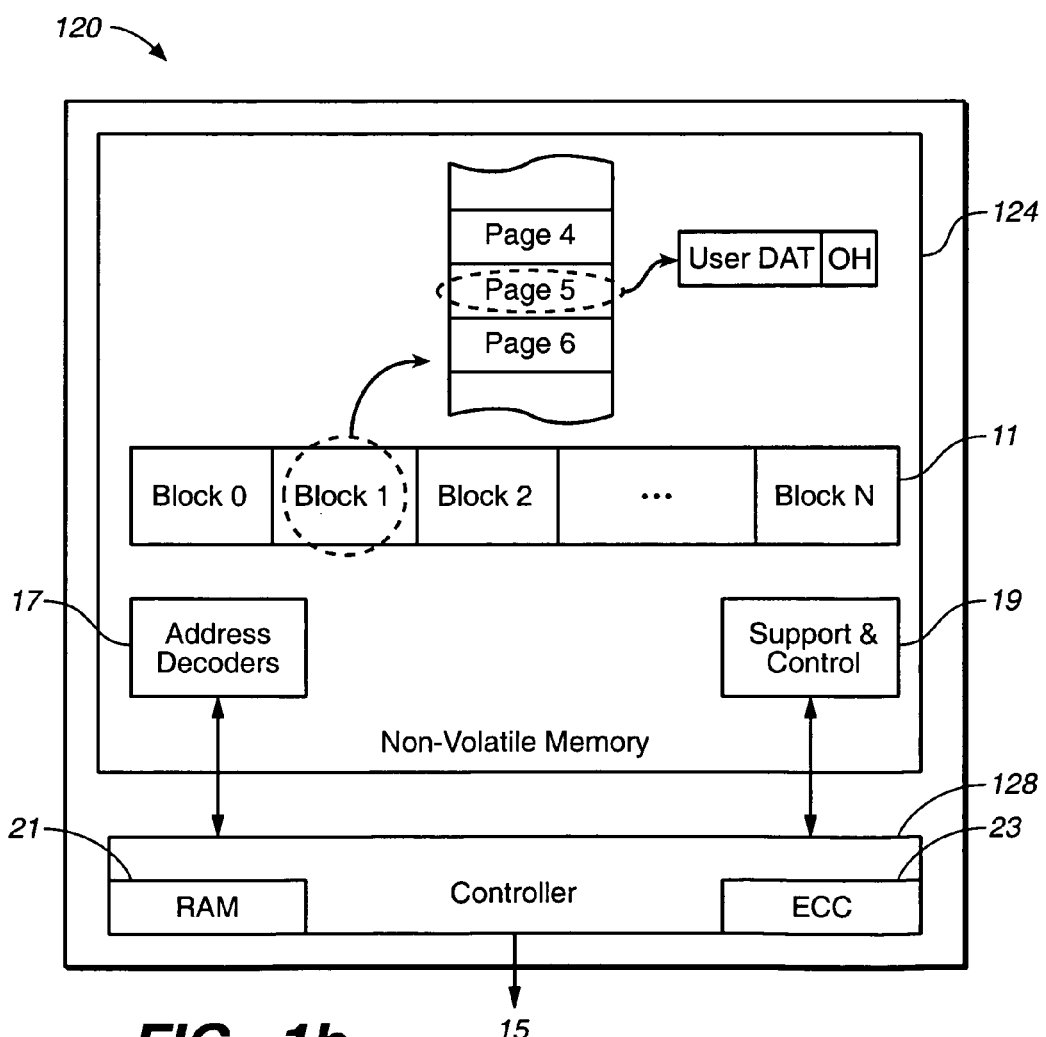
FIG._1b

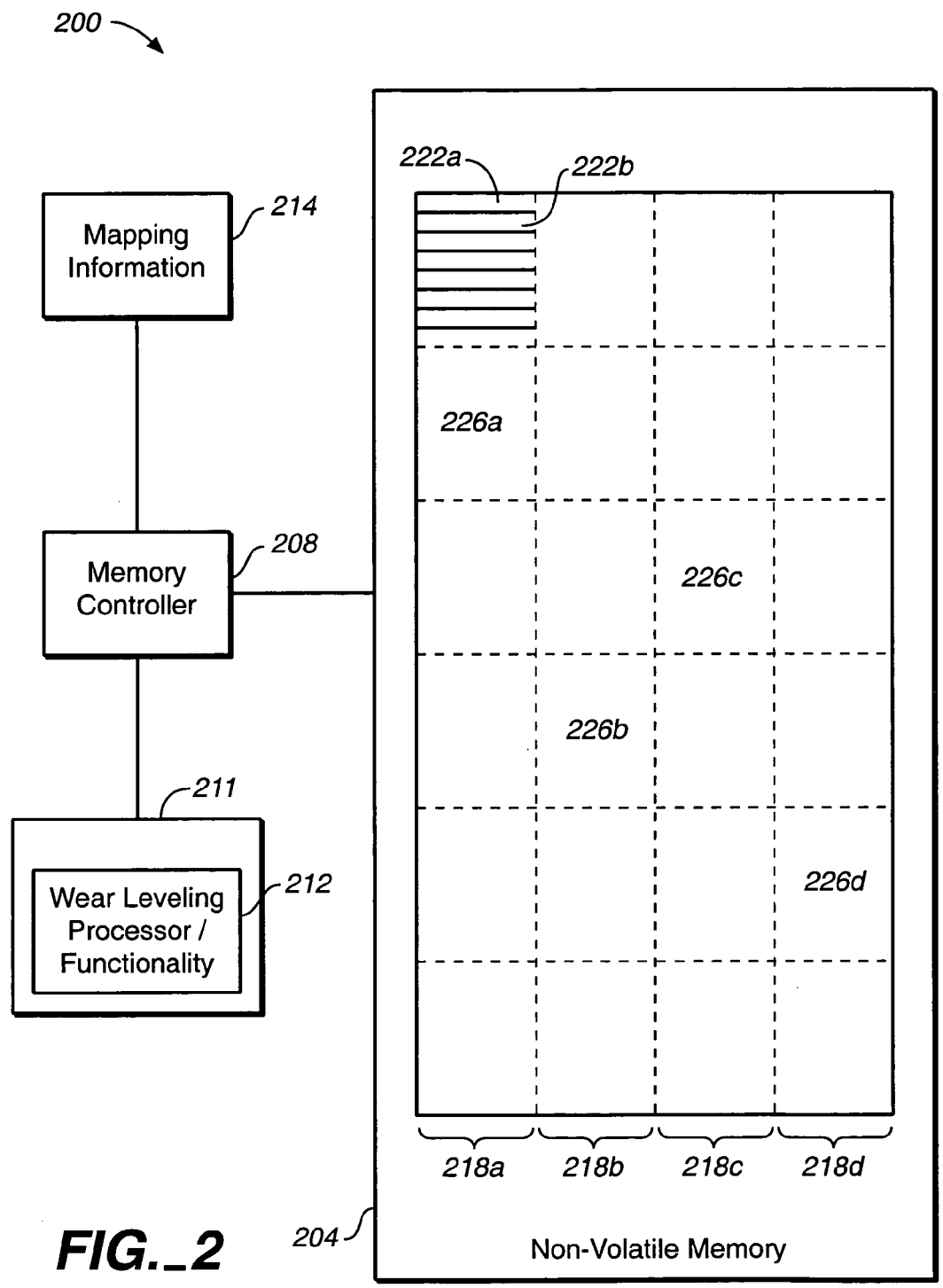
FIG._2

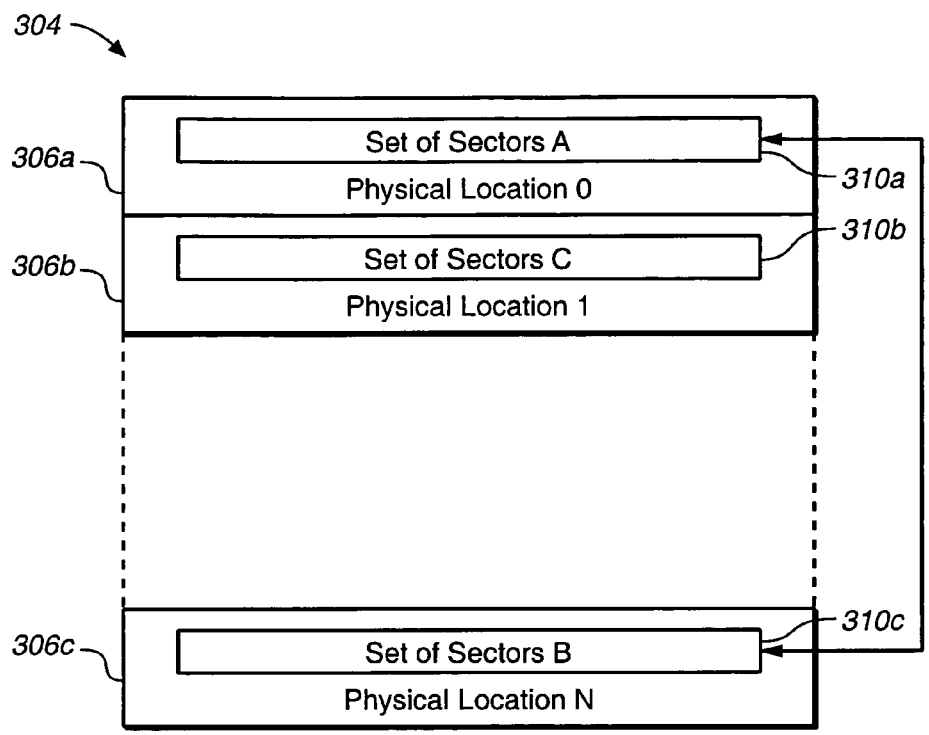
FIG._3a
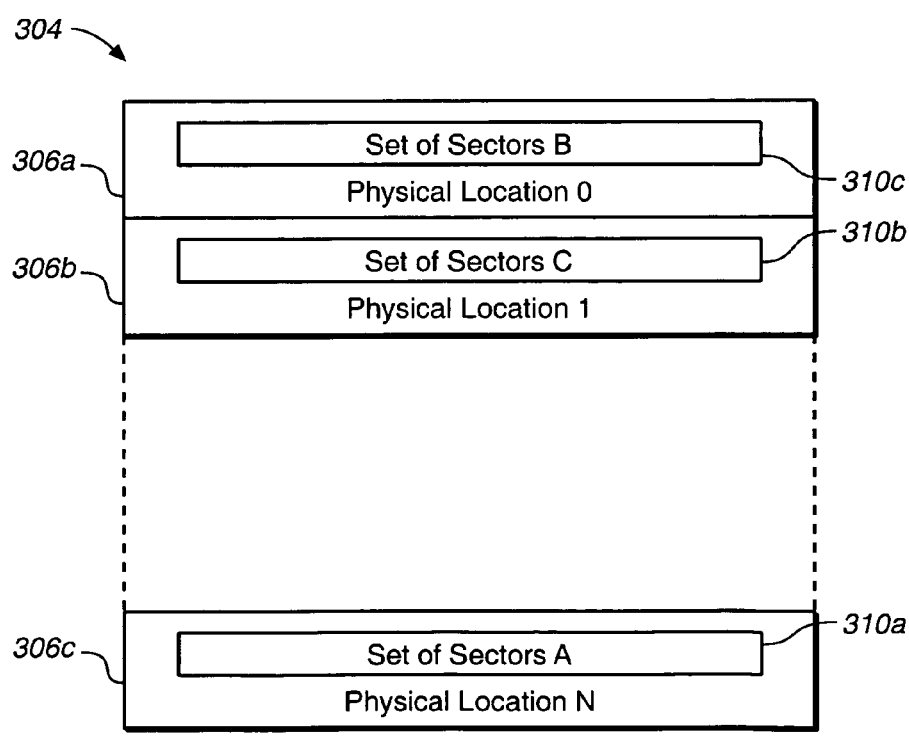
FIG._3b

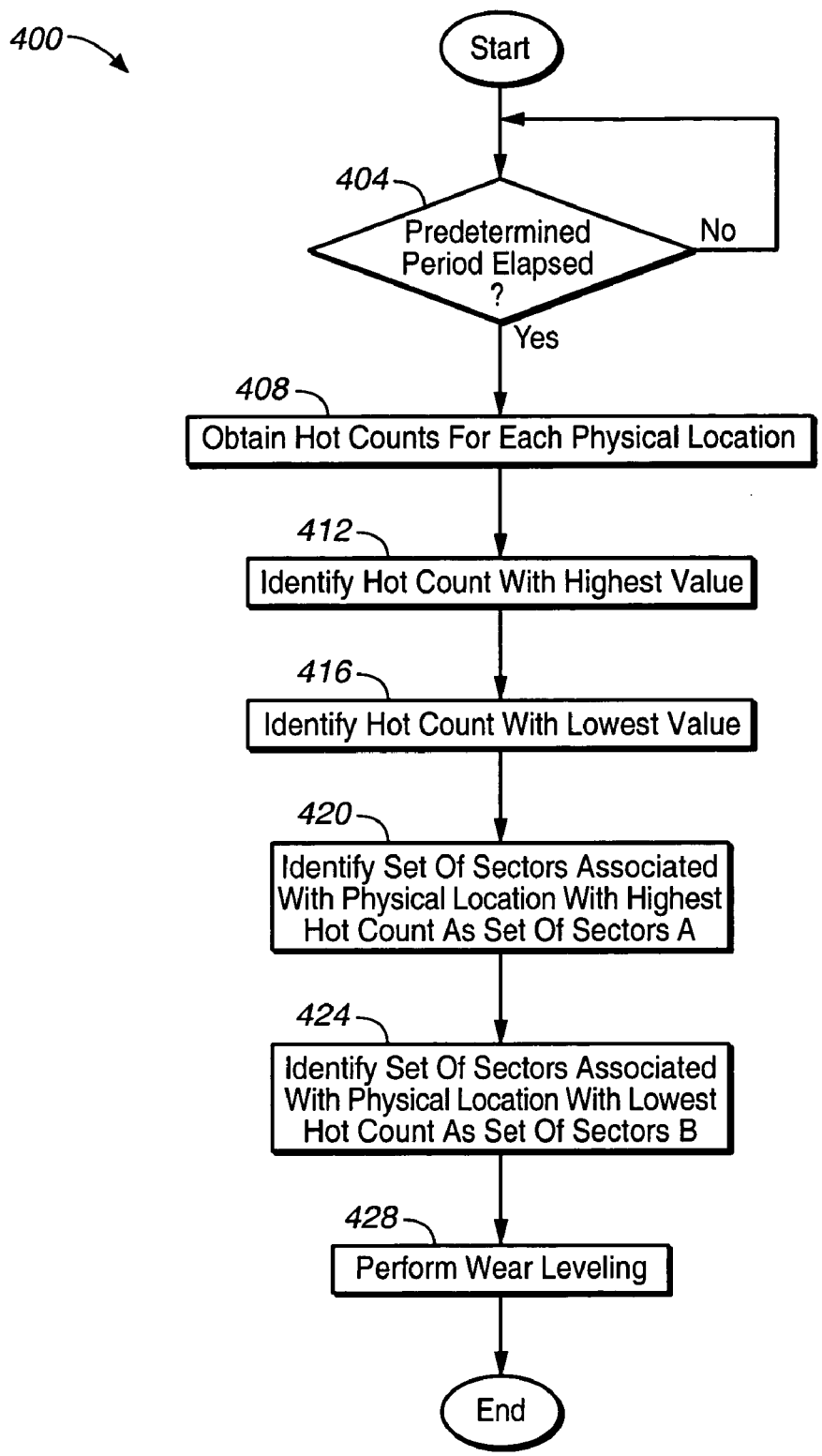
FIG._4

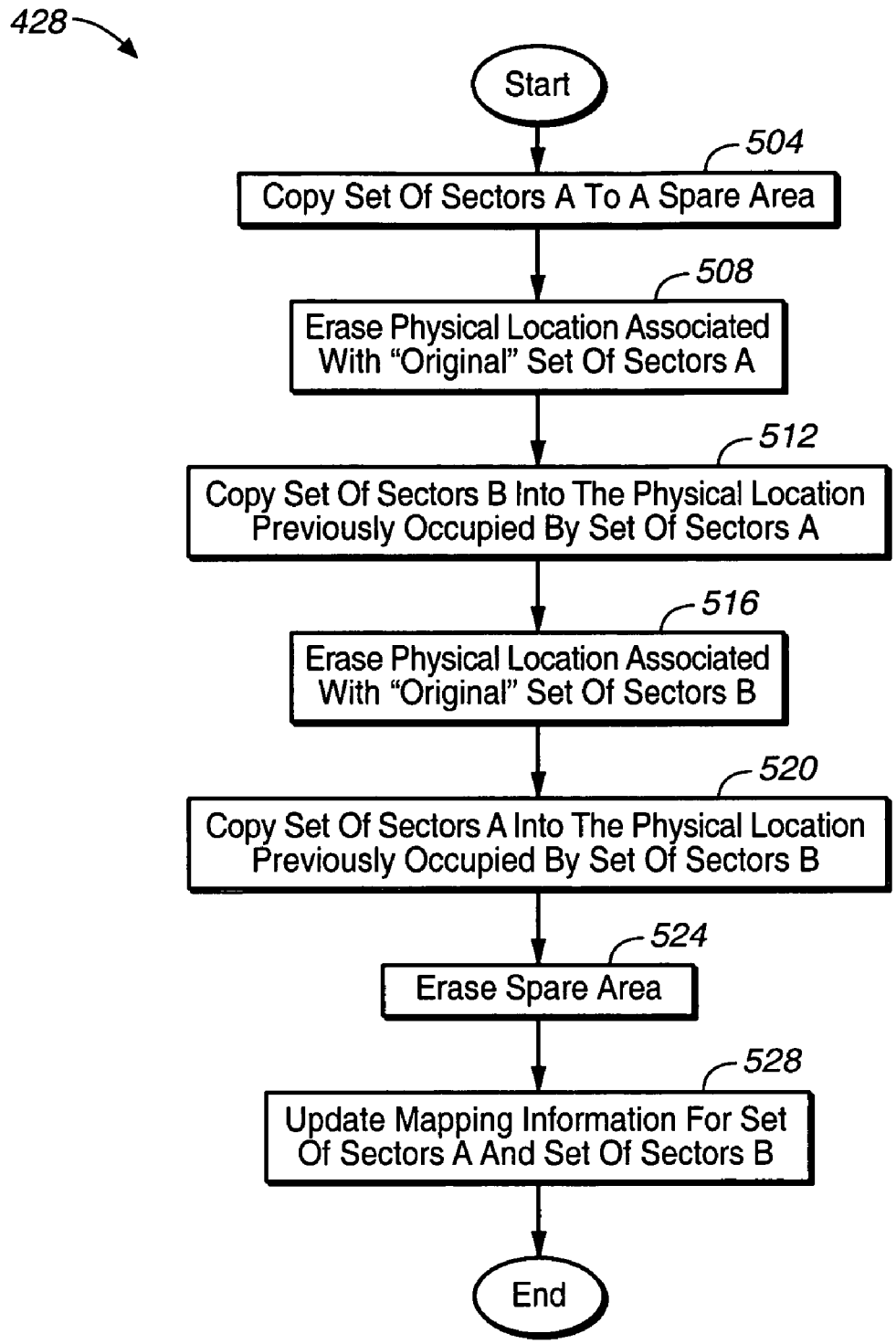
FIG._5

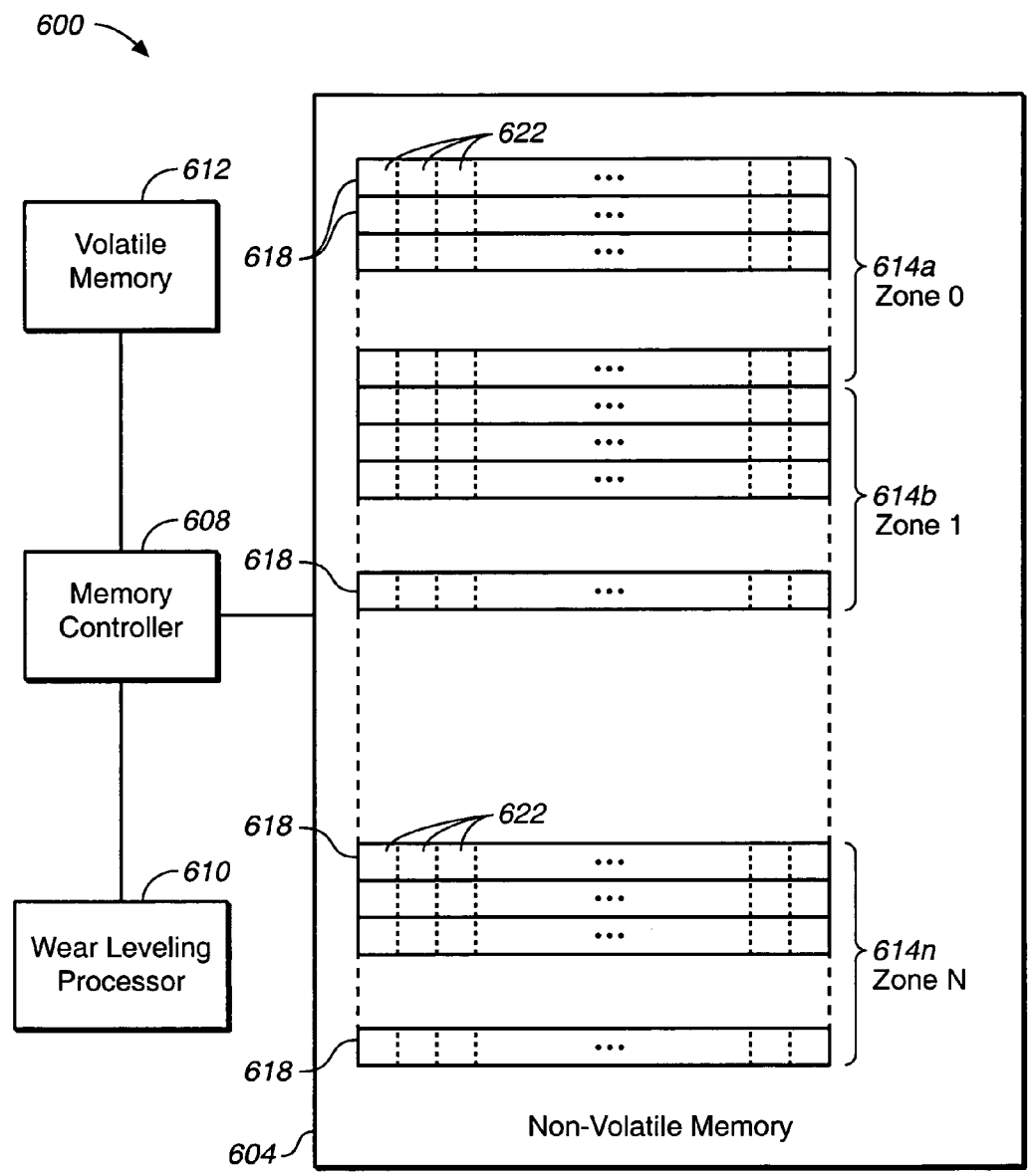
FIG._6

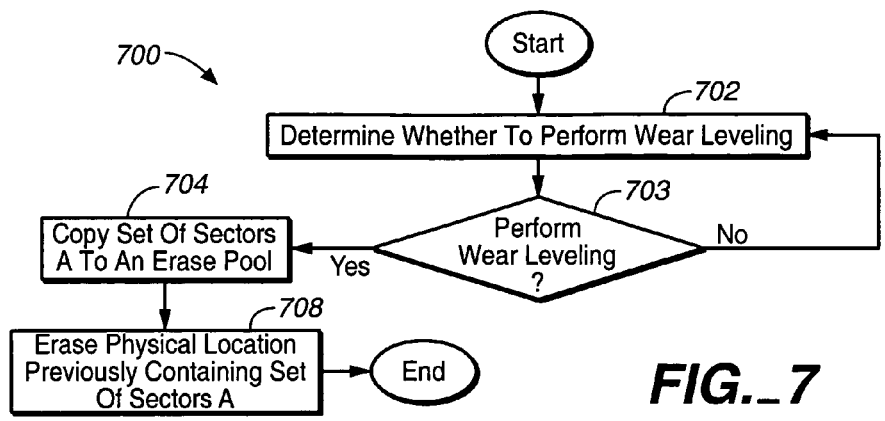
FIG._7
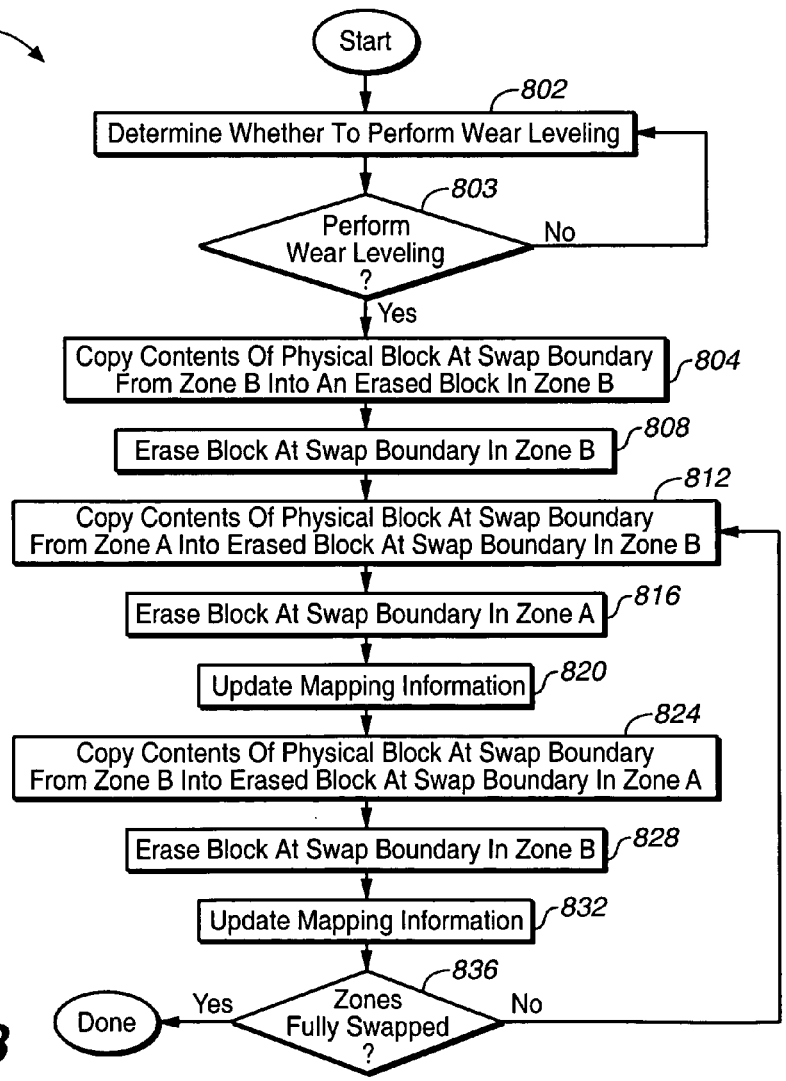
FIG._8

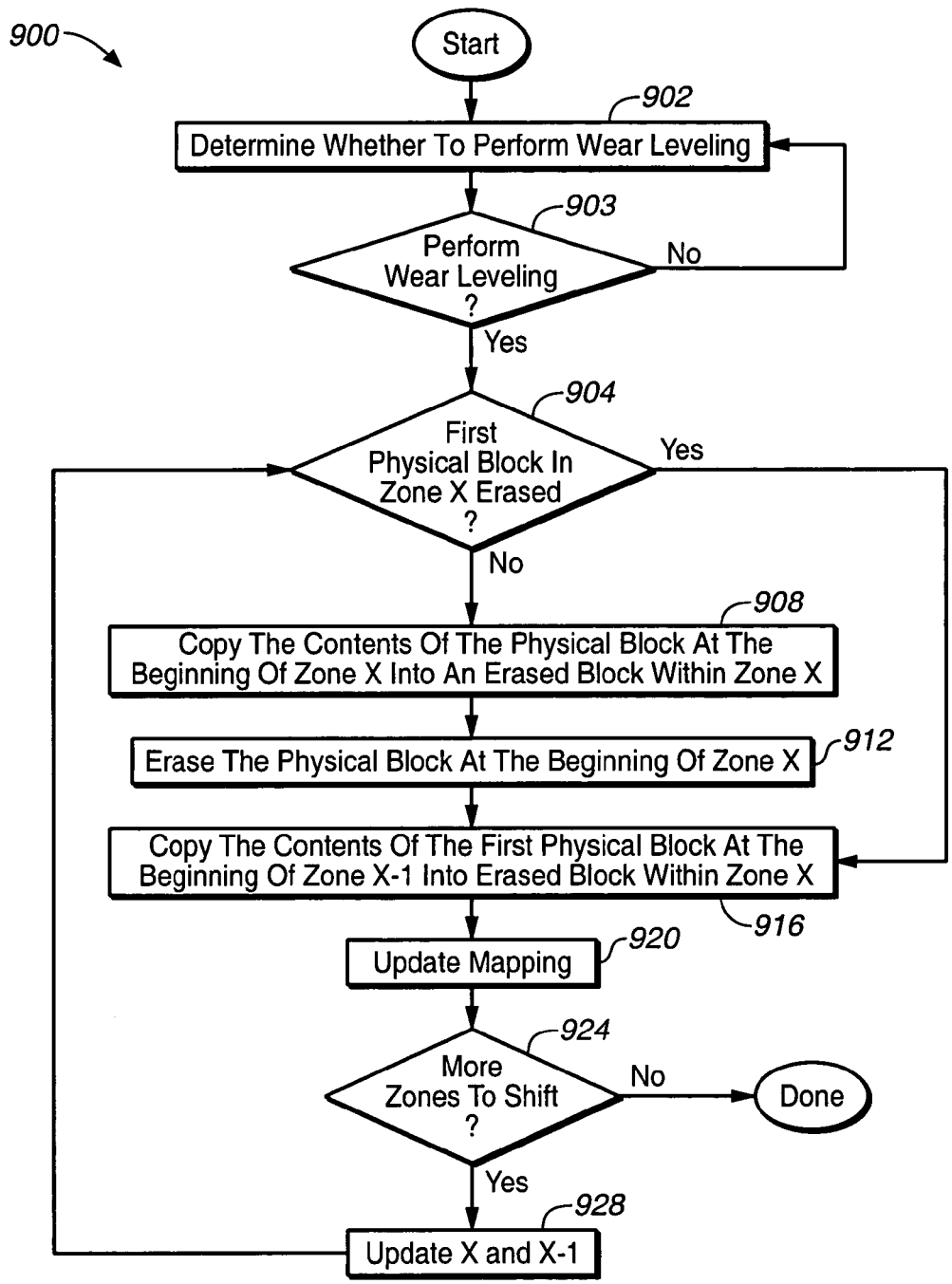
FIG._9

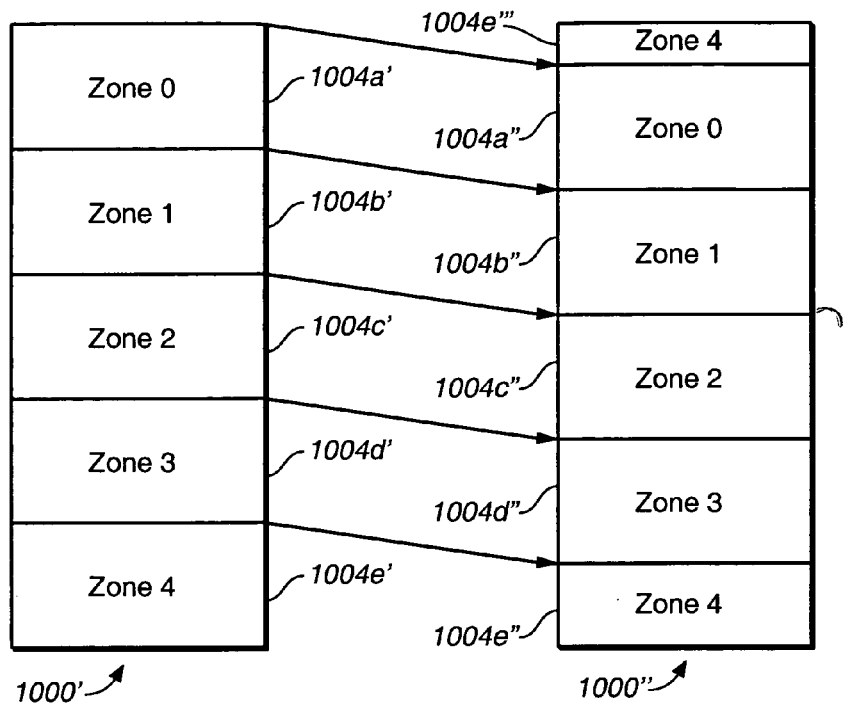
FIG._10
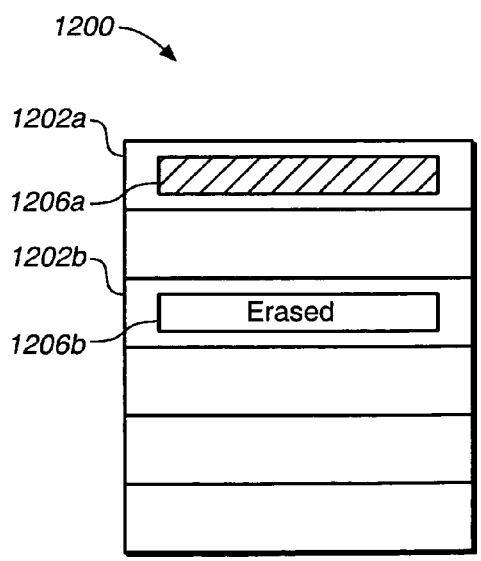
FIG._12a
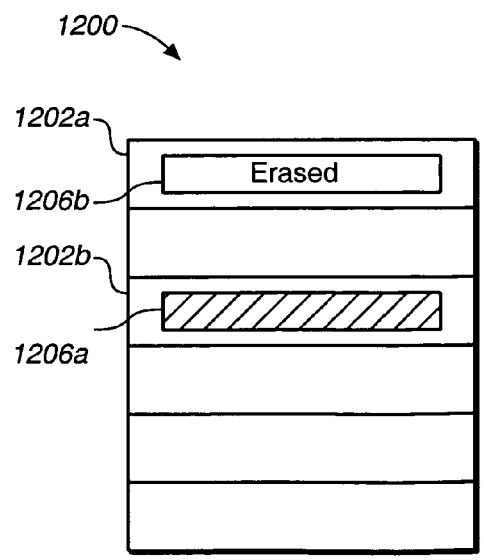
FIG._12b

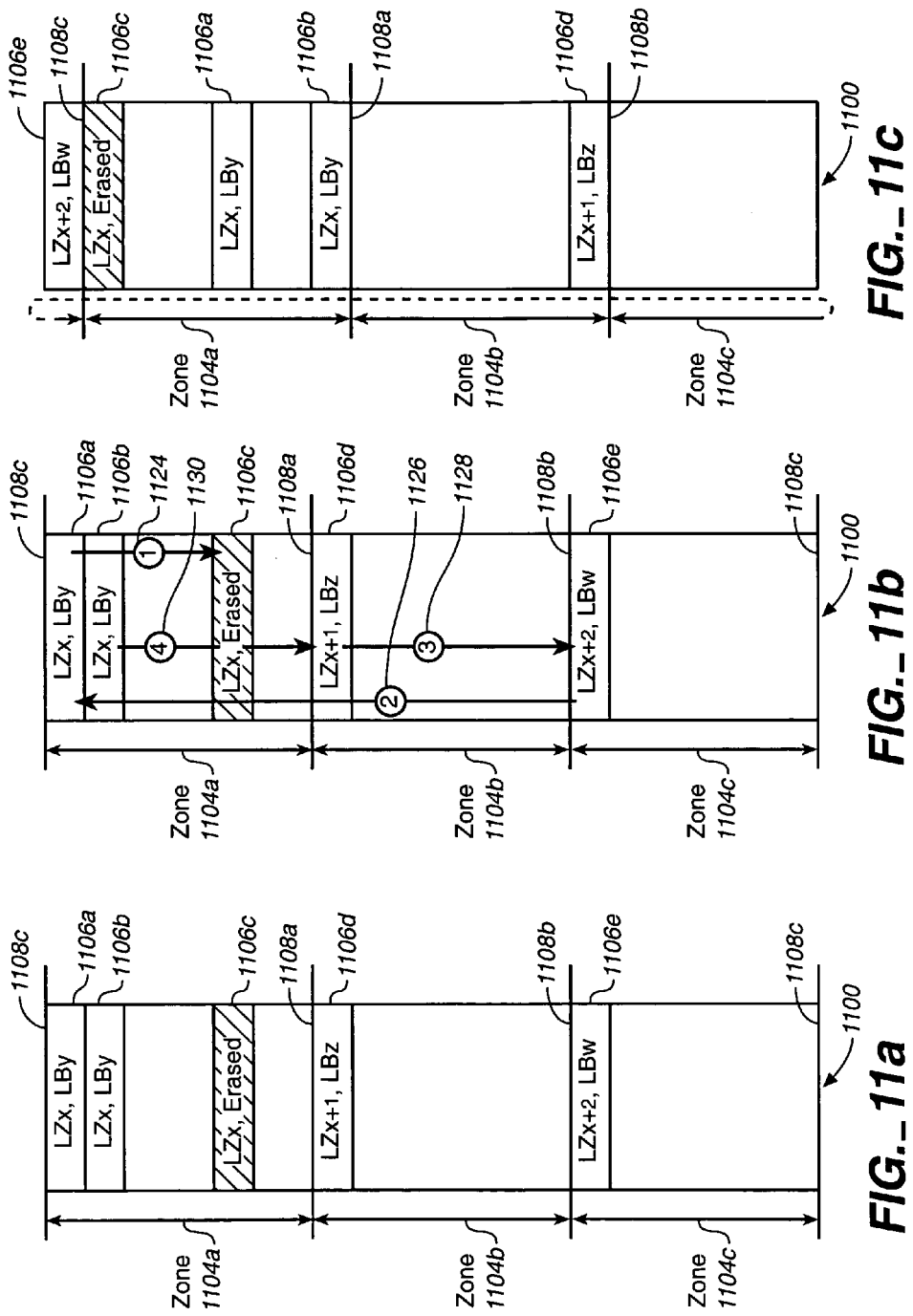
FIG._11c
FIG._11b
FIG._11a

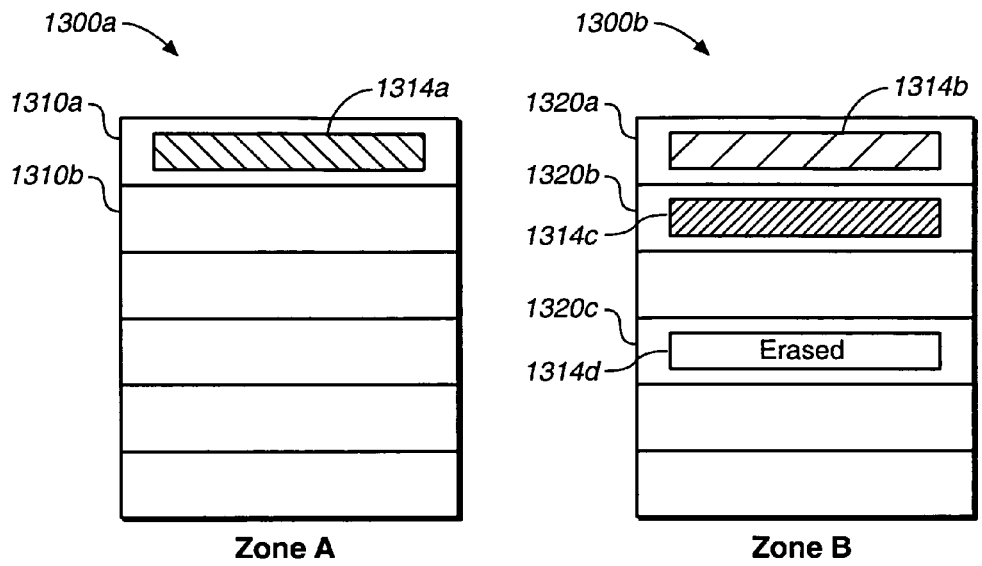
FIG._13a
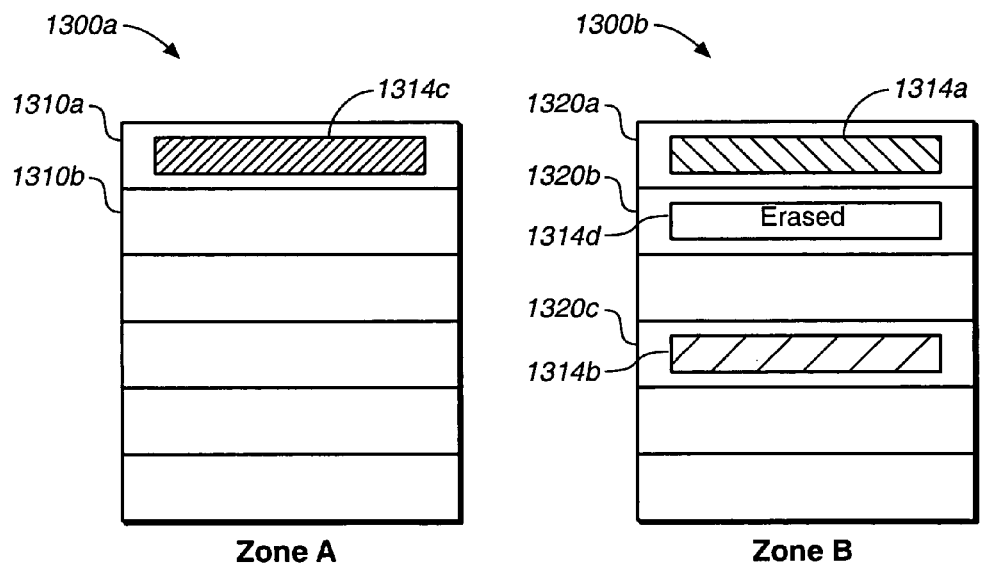
FIG._13b

AUTOMATED WEAR LEVELING IN NON-VOLATILE STORAGE SYSTEMS

CROSS-REFERENCE TO RELATED APPLICATIONS AND PATENTS

The benefit of U.S. provisional Patent Application No. 60/422,173, filed Oct. 28, 2002, is claimed herein.

Also related are co-pending U.S. patent application Ser. No. 10/281,739 entitled "Wear-Leveling in Non-Volatile Storage Systems," filed Oct. 28, 2002; co-pending U.S. patent application Ser. No. 10/281,823 entitled "Maintaining an Average Erase Count in a Non-Volatile Storage System," filed Oct. 28, 2002; co-pending U.S. patent application Ser. No. 10/281,670 entitled "Tracking the Most Frequently Erased Blocks in Non-Volatile Memory Systems", filed Oct. 28, 2002; co-pending U.S. patent application Ser. No. 10/281,824 entitled "Tracking the Least Frequently Erased Blocks in Non-Volatile Memory Systems", filed Oct. 28, 2002; co-pending U.S. patent application Ser. No. 09/766,436 entitled "Partial Block Data Programming and Reading Operations in a Non-Volatile Memory", publication no. 2002/0099904; and U.S. Pat. Nos. 5,890,192, 5,430,859, 6,149,316, 6,081,447, 6,230,233 and 6,594,183.

BACKGROUND OF THE INVENTION

The present invention relates generally to mass digital data storage systems, and, more particularly, to systems and methods for automatically allowing the wear associated with storage areas in a non-volatile storage system to be spread out across its storage areas.

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Although non-volatile memory or, more specifically, non-volatile memory storage cells within flash memory systems may be repetitively programmed and erased, each cell or physical location may only be erased a certain number of times before the cell wears out. In some systems, a cell may be erased up to approximately ten thousand times before the cell is considered to be unusable. In other systems, a cell may be erased up to approximately one hundred thousand times or even up to a million times before the cell is considered to be worn out. When a cell is worn out, thereby causing a loss of use or a significant degradation of performance to a portion of the overall storage volume of the flash memory system, a user of the flash memory system may be adversely affected, as for example through the loss of stored data or the inability to store data.

The wear on cells, or physical locations, within a flash memory system varies depending upon how often each of the cells is programmed. If a cell or, more generally, a memory element, is programmed once and then effectively never reprogrammed, the wear associated with that cell will generally be relatively low. However, if a cell is repetitively written to and erased, the wear associated with that cell will generally be relatively high. As logical block addresses (LBAs) are used by hosts, e.g., systems which access or use a flash memory system, to access data stored in a flash memory system, if a host repeatedly uses the same LBAs to write and overwrite data, the same physical locations or cells within the flash memory system are repeatedly written to and erased, as will be appreciated by those of skill in the art.

When some cells are effectively worn out while other cells are relatively unworn, the existence of the worn out cells generally compromises the overall performance of the flash memory system. In addition to degradation of performance associated with worn out cells themselves, the overall performance of the flash memory system may be adversely affected when an insufficient number of cells which are not worn out are available to store desired data. Often, a flash memory system may be deemed unusable when a critical number of worn out cells are present in the flash memory system, even when many other cells in the flash memory system are relatively unworn.

In order to increase the likelihood that cells within a flash memory system are worn fairly evenly, wear leveling operations are often performed. Wear leveling operations are generally arranged to allow the cells which are associated with particular LBAs to be changed such that the same LBAs are not always associated with the same cells. By changing the cell associations of LBAs, it is less likely that a particular cell may wear out well before other cells wear out.

One conventional wear leveling process involves swapping physical locations to which two relatively large portions of customer or host LBAs are mapped. That is, the LBAs associated with relatively large sections of storage cells are swapped. Such swapping is initiated through a manual command from a customer, e.g., through the use of a host and, as a result, is not transparent to the customer. Also, swapping operations that involve moving data between two relatively large sections of storage cells are time consuming and, hence, inefficient. Additionally, the performance of the overall flash memory system may be adversely affected by swapping operations of a relatively long duration which consume significant resources, as for example time and processing power, associated with the overall flash memory system. Moving data from a first location typically involves copying the data into another location and erasing the data from the first location.

It is possible to avoid wear leveling by simply allowing cells to wear. Once the cells have effectively worn out, the sectors assigned to the cells may be reassigned by mapping the addresses associated with the sectors to spare areas. As the number of spare areas or cells is limited and valuable, there may not always be spare areas to which sectors associated with unusable cells may be mapped. In addition, effectively remapping sectors only after cells have become unusable generally allows performance of the overall flash memory system to degrade.

Therefore, what is desired is a method and an apparatus for efficiently and transparently performing wear leveling within a flash memory storage system. That is, what is needed is an automated wear leveling process which does not adversely affect the performance of a flash memory storage system while promoting more even wear in physical locations associated with the flash memory storage system.

SUMMARY OF THE INVENTION

The present invention relates to a system and a method for performing automated wear leveling in a non-volatile memory system. According to one aspect of the present invention, a method for performing automated wear leveling in a memory system that includes a first zone, which has a first memory element that includes contents, and a second zone includes identifying the first memory element and associating the contents of the first memory element with the second zone while disassociating the contents of the first memory element from the first zone. In one embodiment, associating the contents of the first memory, element with the second involves copying contents of a second memory element into a third memory element, then moving the contents of the first memory element into the second memory element.

By moving relatively small amounts of data using a gradual, automatic wear-leveling process into different memory elements, e.g., physical blocks, during a wear leveling process, in one embodiment, a more even wear of the memory elements within a memory device may be achieved, as memory elements which are associated with logical block addresses that are often written to and erased may be replaced by memory elements which are have not been often written to and erased prior to being associated with the logical block addresses which are often written to and erased. Likewise, memory elements associated with logical block addresses which are rarely written to and erased may be replaced by memory elements which were associated with logical block addresses that are written to and erased more often, thereby also enabling the wear of memory elements to become more even. When relatively small amounts of data are moved to different memory elements, the performance penalties associated with performing wear leveling may be significantly reduced.

According to another aspect of the present invention, a method for performing automated wear leveling in a memory system involves a direct addressing scheme that includes a first memory element and a second memory element includes providing a first set of information that is contained in the first memory element to the second memory element and providing a second set of information contained in the second memory element to the first memory element. When access to the first set of information is desired, e.g., from a host system which accesses the memory system, the second memory element may then be accessed, and when access to the second set of information is desired, the first memory element may be accessed. In one embodiment, mapping information associated with the memory system is updated to indicate that the first set of information is contained in the second memory element, and to indicate that the second set of information is contained in the first memory element.

According to still another aspect of the present invention, in a zone migration scheme, a memory system that stores information includes a first zone with a first memory element and a second zone with a second memory element. The first memory element is arranged to include contents, e.g., data information. A wear leveling processor of the memory system is arranged to identify the first memory element and to associate the contents of the first memory element with the second memory element. In one embodiment, the second zone includes a third memory element, and the wear leveling processor copies the contents of the second memory element into the third memory element, erases the second memory element, and copies the contents of the first memory element into the second memory element. In such an embodiment, the memory system may include mapping information which is updated by the wear leveling processor to indicate that the second memory element is associated with the first zone and to indicate that the first memory element is disassociated from the first zone.

In accordance with yet another aspect of the present invention, a method for performing automated wear leveling in a memory system involves a zone swapping scheme which includes identifying a first zone associated with the memory system and identifying a second zone that is also associated with the memory system. The first zone includes a first memory element that contains first contents, and the second zone includes a second memory element that includes second contents. The method also includes storing the first contents into the second memory element and storing the second contents into the first memory element. Once the contents are stored, when the first contents are accessed, the first contents are accessed in the second memory element and when the second contents are accessed, the second contents are accessed in the first memory element. In one embodiment, substantially all original contents of memory elements in the first zone are stored into memory elements in the second zone, and substantially all original contents of the memory elements in the second zone are stored into the memory elements in the first zone.

Additional aspects, advantages and features of the present invention are included in the following description of exemplary examples thereof. All patents, patent applications, articles, patent publications and other publications referenced herein are hereby incorporated herein in their entirety for all purposes.

BRIEF DESCRIPTION OF THE DRAWINGS

The invention may best be understood by reference to the following description taken in conjunction with the accompanying drawings in which:

FIG. 1a is a diagrammatic representation of a general host system which includes a non-volatile memory device.

FIG. 1b is a diagrammatic representation of a memory system, e.g., memory device 120 of FIG. 1a.

FIG. 2 is a diagrammatic representation of an embodiment of a non-volatile memory system on which a direct addressing wear leveling scheme may be implemented.

FIG. 3a is a diagrammatic representation of an embodiment of a non-volatile memory which includes physical locations and sets of sectors.

FIG. 3b is a diagrammatic representation of an embodiment of a non-volatile memory which includes physical locations and sets of sectors, e.g., non-volatile memory 304 of FIG. 3a, after sets of sectors have been swapped.

FIG. 4 is a process flow diagram which illustrates the steps associated with identifying sets of sectors within a non-volatile memory which are to be subjected to a wear leveling process.

FIG. 5 is a process flow diagram which illustrates the steps associated with a wear leveling process, i.e., step 428 of FIG. 4.

FIG. 6 is a diagrammatic representation of an embodiment of a non-volatile memory system which includes zones.

FIG. 7 is a process flow diagram which illustrates the steps associated with a general wear leveling process in an intra-zone erase-pooling context.

FIG. 8 is a process flow diagram which illustrates the steps associated with one method of performing wear leveling in the context of zone swapping.

FIG. 9 is a process flow diagram which illustrates the steps associated with one method of wear leveling using a zone boundary migration.

FIG. 10 is a diagrammatic representation of the initial state of a memory device and the state of the memory device after a zone boundary migration process or processes, e.g., process 900 of FIG. 9.

FIG. 11a is a diagrammatic representation of the initial state of a memory device before a zone boundary migration process.

FIG. 11b is a diagrammatic representation of a memory device, i.e., device 1100 of FIG. 11a, during initial zone boundary migration steps.

FIG. 11c is a diagrammatic representation of a memory device, i.e., device 1100 of FIG. 11a, after initial zone boundary migration steps have occurred.

FIG. 12a is a diagrammatic representation of a zone which includes physical blocks prior to an intra-zone wear leveling process.

FIG. 12b is a diagrammatic representation of a zone, i.e., zone 1200 of FIG. 12a, which includes physical blocks after an intra-zone wear leveling process.

FIG. 13a is a diagrammatic representation of zones which includes physical blocks prior to a zone swapping wear leveling process.

FIG. 13b is a diagrammatic representation of zones, i.e., zones 1300 of FIG. 13a, which includes physical blocks after a zone swapping wear leveling process.

DETAILED DESCRIPTION OF EXEMPLARY EMBODIMENTS

A. Memory Organization and Basic Definitions

The present inventions are related to wear leveling in memory systems that are capable of deteriorating in performance over time as the number of erase and write cycles increases. While the embodiments described herein describe non-volatile EEPROM based memory systems, the various aspects of the present inventions are applicable to any type of storage medium susceptible to "wear". For example, an emerging type of non-volatile memory technology is phase-change memory. Information is stored by changing the phase of a given material. Such systems also may be prone to "wear", where the storage medium is less capable of storing information as the number of times the medium has been cycled increases. The present inventions can be readily applied to such technologies.

In one embodiment, non-volatile memory storage cells within flash memory storage systems may be repetitively programmed and erased, although each cell may only be erased a certain number of times before the cell wears out. When a cell wears out, a relatively significant degradation of performance associated with the portion of the overall storage volume of the flash memory storage system that includes the worn out cell occurs, and data stored in that portion may be lost, or it may become impossible to store data in that portion. An automated wear leveling process which does not adversely affect the performance of a flash memory storage system significantly allows wear leveling to occur both efficiently and substantially regularly. As a result, cells associated with the flash memory storage system may wear out more evenly, i.e., certain cells will generally not-wear out much more quickly than other cells. Hence, the life of the flash memory storage system may be extended without a significant performance penalty. In addition, as the wear leveling occurs substantially automatically, it becomes unnecessary for a user to remember to initiate a wear leveling process.

Referring initially to FIG. 1a, a general host system that includes a non-volatile memory device, e.g., a memory card such as a CompactFlash memory card, will be described. A host or computer system 100 generally includes a system bus 104 that allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing or storing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, portable computing device, an audio player, or a video player. It should be appreciated, however, that host system 100 may generally be substantially any system which stores data or information, and retrieves data or information. It may also be a system that either only captures data or only retrieves data. That is, host system 100 may be a dedicated system which stores data, or host system 100 may be a dedicated system which reads data. By way of example, host system 100 may be a memory writer which is arranged only to write or store data. Alternatively, host system 100 may be a device such as an MP3 player which is typically arranged to read or retrieve data, and not to capture data.

A non-volatile memory device 120 is arranged to interface with bus 104 to store information. An optional interface circuit block 130 may allow non-volatile memory device 120 to communicate with bus 104. When present, interface circuit block 130, e.g., and interface, serves to reduce loading on bus 104. Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module, or as multiple discrete components. One embodiment of a non-volatile memory device 120 will be described below in more detail with respect to FIG. 1b. Non-volatile memory device 120 may be substantially any suitable non-volatile memory device, e.g., a removable memory card or an embedded sub-system.

Non-volatile memory 124 is arranged to store data such that data may be accessed and read as needed. The processes of storing data, reading data, and erasing data are generally controlled by memory control system 128. In one embodiment, memory control system 128 manages the operation of non-volatile memory 124 such that its lifetime is substantially maximized by essentially causing sections of non-volatile memory 124 to be worn out substantially equally.

Non-volatile memory device 120 has generally been described as including a memory control system 128, i.e., a controller. Specifically, non-volatile memory device 120 may include separate chips for non-volatile memory 124 and controller 128 functions. By way of example, while non-volatile memory devices including, but not limited to, PC cards, CompactFlash cards, MultiMedia cards, and Secure Digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip. Additionally, the controller may be located on the host system, and the non-volatile memory device 120 connected to the controller on the host through a connector or any other type of interface. Regardless, the scope of the present inventions encompass all different forms and combinations of a memory system, wherein the level of wear within a memory medium is controlled by a control system. For example, the controller may be implemented within software on the microprocessor of the host system.

With reference to FIG. 1b, non-volatile memory device 120 will be described in more detail in accordance with an embodiment of the present invention. It should be appreciated that FIG. 1b shows an embodiment of non-volatile memory device 120 that includes a single flash memory chip 124 and a separate controller 128. Memory 124 may be an array of memory cells along with suitable addressing and control circuitry formed on a semiconductor substrate, wherein one or more bits of data are stored in the individual memory cells by storing one of two or more levels or distributions of charge in individual memory elements of the memory cells. A non-volatile flash electrically erasable programmable read only memory (EEPROM) is an example of a common type of memory for such systems.

In the described embodiment, controller 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 may include a general purpose microprocessor or microcontroller which has associated memory, various logic circuits, and the like. One or more state machines are often also included for controlling the performance of specific routines.

Memory cell array 11 is typically addressed by control system 128 through address decoders 17. Decoders 17 may apply the correct voltages to word and bit lines of array 11 in order to program data to, read data from, or erase a group of memory cells being addressed by the control system 128. Additional circuits 19 may include data registers to temporarily store data being read or written, programming drivers that control voltages applied to elements of the array that depend upon the data being programmed into an addressed group of cells, and state machines to control sequencing of the various voltages and control signals. Circuits 19 may also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

In one particular embodiment, array 11 is divided into a large number of BLOCKS 0–N of memory cells. In the preferred embodiment, a block is a unit of erase, the minimum number of memory cells that are erased together. Each block is typically divided into a number of pages, as also illustrated in FIG. 1b. A page is the minimum unit of programming and one or more sectors of user data are typically stored within each page. A sector is the smallest unit of logical data that the host will address or transfer to or from the non-volatile memory. In disk drive applications this is typically 512 bytes. Some non-volatile memories allow partial page programming in which the individual bits remaining in an erased state after a first programming can be programmed in subsequent page program operations without first erasing the page. Some multistate memories may even allow bits already programmed in a lower programmed state to be programmed into a higher state in subsequent page program operations. In these memories, sectors or even portions of sectors may be programmed at different times. Nevertheless, one page remains the basic unit of programming; it is just that some bits may be masked out and programmed later. The present inventions can be applied to any suitable memory system regardless of the physical implementation of the units of erase, read and/or write.

As shown in FIG. 1b of the described embodiment, one page may include both user data and overhead data. Overhead data typically includes an error correction code (ECC) that has been calculated from the user data contained in the page, and the ECC may include some or all of the overhead data. A portion 23 of the control system 128 calculates the ECC when data is being programmed into array 11, and also checks the ECC when data is being read from array 11. Overhead data may also include the logical address of the user data, the physical addresses of the page and/or block, address map information, the number of erase cycles experienced by the physical block, encryption information and/or other statistics or data. Part or all of the overhead data may be stored in each page, as illustrated in FIG. 1b. Alternately part or all of the overhead data may be stored in a specific location within each block, or it may even be stored in a block separate from the user data.

One sector of data is most commonly included in each page but two or more sectors may instead form a page, or a page may be smaller than a sector. For example, U.S. Pat. Nos. 5,890,192 and 5,430,859, herein incorporated by reference in their entirety, describe programming and reading data in units of chunks, in which a chunk is a fraction of a sector. In some memory systems, one sector is included in one page, and one page may form a block. More commonly, in NAND memory systems one or more sectors are included in each page, and 8, 16, or 32 pages form a block. In other memory systems blocks are formed from a relatively large number or pages such as 512, 1024, or even more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, referenced earlier.

When a particular section, e.g., a group of memory elements, of non-volatile memory 124 is programmed and erased repeatedly, that particular section generally wears out more quickly than a section which is not programmed continuously. In order to effectively "even out" the wear of different areas within non-volatile memory 124, wear leveling may be automatically performed such that sections which are programmed repeatedly are programmed less, while sections that are programmed less frequently may be utilized rather than over-cycling the sections which are repeatedly programmed.

In general, to perform wear leveling, a logical address (e.g., logical block address and/or cylinder-head-sector address) which is associated with one or more physical locations, e.g., one or more cells or memory elements, which have been programmed a given number of times may be re-associated with a different physical location which has not been programmed repeatedly. For example, the contents of the most programmed physical location may be swapped with the contents of the least programmed physical location, to cause the wear of the physical locations to be essentially evened out. Such a process may occur in a direct mapping addressing wear leveling scheme in which a given logical address is associated with a specific physical location for "long" periods of time until reassigned by some specific event such as wear leveling. This scheme is sometimes referred to as (static) associative mapping.

Wear leveling may also be performed in systems using indirect addressing to map logical to physical addresses. In these systems a given logical address maps to different physical locations at different times, often changing with each logical update. Typically a collection of temporarily unused but physically erased blocks form an erase pool. In erase-pooling wear leveling schemes, the contents of the most worn physical location in a region may be moved to an erased physical location within that same region to slow down the rate at which the most worn physical location is worn out, or the zones may be swapped or redefined to prevent certain physical locations from being worn out at a much higher rate than other physical locations.

The present inventions can further be implemented in systems using zones of physical memory. A zone may be any partitioned subset of the physical memory or memory system into which a specified range of logical blocks is mapped. A greater number of physical blocks may be included in a zone than the number of logical blocks mapped into it, in order to provide extra pre-erased blocks. For example, a memory system capable of storing 64 Megabytes of data may be partitioned into four zones that store 16 Megabytes of data per zone. The range of logical blocks is then also divided into four groups, one group for the physical blocks of each of the four zones. Logical blocks are constrained, in a typical implementation, such that the data of each are never written outside of a single physical zone into which the logical blocks are mapped. In a memory cell array divided into planes (sub-arrays), which each have their own addressing, programming and reading circuits, each zone preferably includes blocks from multiple planes, typically the same number of blocks from each of the planes. Zones are primarily used to simplify address management such as logical to physical translation, resulting in smaller translation tables, less RAM memory needed to hold these tables, and faster access times to address the currently active region of memory, but because of their restrictive nature can result in less than optimum wear leveling.

As the sizes of memory systems increase (today exceeding 1 Gigabytes of memory), wear leveling over the entire physical memory can be cumbersome, time consuming and require excessive memory space to maintain wear statistics. However, wear leveling may be performed within a zone (intra-zone) by wear leveling the units of erase within a zone, or among zones (inter-zone) by wear leveling the units of erase between zones, or swapping entire zones where one zone has more wear than another zone. In another variant, dynamic or offset zone wear leveling may be implemented. In such an embodiment, the size and/or the location of the zone is not static. For example, it may be beneficial to allocate one or more units of erase from a first zone to a second zone, causing the second zone to be larger than the first zone. Additionally, the physical locations of a zone may initially start in one physical portion of the memory, but after a wear leveling operation, the zone may be moved within the memory, either by an offset or completely. This may require other zones to be similarly moved by an offset or some other increment to allow full utilization of the physical memory.

A direct mapping addressing scheme will be described below with respect to FIGS. 2 through 5, while an erase-pooling scheme will be described below with reference to FIGS. 6 through 10.

B. Direct Mapping Wear Leveling

In a direct mapping addressing scheme, the data associated with a particular host logical address (e.g., logical block address or LBA) is generally stored in a specific physical location even after repeated write/erase cycles. The described embodiment is discussed with reference to logical block addresses, but any type of logical address may be utilized. When the host system writes or rewrites to the same logical block address, the data is written to the same physical address. Typically, the physical memory located at the physical address is erased and then rewritten with the new and/or updated data associated with the LBA. The logical to physical address association generally remains until the mapping associated with the LBA is changed as a result of a wear leveling procedure, for example. Since certain LBAs may be repeatedly programmed, the physical locations associated with those LBAs may be worn out relatively quickly. By remapping a repeatedly programmed LBA to a physical location that was previously associated with a rarely programmed and, hence, rarely erased, physical location, the wear on the two physical locations may be evened out.

FIG. 2 is a diagrammatic representation of a non-volatile memory system on which a direct addressing wear leveling scheme may be implemented. A non-volatile memory system 200 includes a non-volatile memory 204 which is controlled, e.g., allocated, by a memory controller 208. Firmware 211, which may include wear leveling functionality, or a wear leveling processor 212 cooperates with memory controller 208 to perform a wear leveling process on non-volatile memory 204. Alternately, wear leveling may be performed by circuitry, firmware, software, or any combination thereof. Mapping information 214 is used by memory controller 208 in order to map LBAs to physical locations within non-volatile memory 204.

Non-volatile memory 204 is generally divided into planes 218a–218d. Each plane may contain any number of units of erase, e.g., blocks which contain physical pages. Block 226a is one of several blocks associated with plane 218a. Similarly block 226b is one of several blocks associated with plane 218b. Each block contains one or more pages: page 222a and page 222b are two pages associated with the top block of plane 218a. One block from each of two or more different planes can be combined to form a metablock. For example blocks 226a, 226b, 226c, and 226d may be combined to form metablock 226. In the described embodiment, memory controller 208, in cooperation with wear leveling processor 212, is arranged to effectively swap blocks or metablocks. Swapping blocks entails-swapping the contents of data within blocks such that the physical location of blocks and, in some instances, metablocks, is changed with respect to the LBAs associated with the sectors, blocks or metablocks. Direct mapping is commonly used in some NOR memories in which a single page forms a block and the basic unit of both write and erase is one page.

FIG. 3a is a diagrammatic representation of a non-volatile memory embodiment that includes physical locations and sets of. A non-volatile memory 304 includes physical locations 306 that contain data in sets of sectors 310. Although substantially any sets of sectors 310 may be swapped or otherwise exchanged, the set of sectors 310 which is located in the physical location 306 that has the most wear, or has the highest cycle count, is typically swapped with the set of sectors 310 which is located in another physical location 306 that has the least wear. It should be appreciated that in the absence of cycle count information, locations may be selected at random or may be selected algorithmically.

For purposes of discussion, physical location "0" 306a has the most wear, while physical location "N" 306c has the least wear. That is, data contained within physical location "0" 306a has been erased fairly often, while data contained within physical location "N" 306c has been erased less often. Hence, in order to even the wear associated with physical locations 306 within non-volatile memory 304, the contents of physical location "0" 306a may be swapped with the contents of physical location "N" 306c in a wear leveling process. In other words, set of sectors "A" 310a may be swapped with set of sectors "B" 310c such that set of sectors "A" 310a is stored in physical location "N" 306c and set of sectors "B" 310c is stored in physical location "0" 306a, as shown in FIG. 3b, which are associated with host logical block addresses that are also swapped. Therefore, the next time set of sectors "A" 310a is to be erased, the erasing procedure will occur with respect to physical location "N" 306c. Accordingly, the cycle count associated with physical location "N" 306c will be incremented, as the cycle count generally tracks the number of erase and write cycles associated with a particular physical location 306.

In general, within a direct addressing scheme, a wear leveling process may be automatically initiated when a triggering condition is met. The triggering condition may be the end of a predetermined time period or that the cycle count of one or more physical locations reaches a relative or absolute threshold level, or when one or more physical locations is determined to exhibit a significantly degraded level of performance. It may be triggered when a particular number of host write operations occurs. Other methods used to initiate a wear leveling process include, but are not limited to, tracking a number of host operations and initiating wear leveling when the number of host operations reaches a particular number, and generating random or pseudo-random numbers which are used to commence wear leveling processes.

With reference to FIG. 4, the steps associated with identifying one or more sectors within a non-volatile memory which are to be subjected to a wear leveling process will be described. A process 400 of identifying one or more sectors which are to be swapped begins at step 404 in which it is determined whether a triggering condition has been met. That is, a determination is made as to whether a wear leveling process is to be initiated. Such a determination may be made by the memory controller which controls the non-volatile memory. In the described embodiment, the determination of whether a triggering condition has been met is a determination of whether a predetermined time period has elapsed, e.g., since the last wear leveling process. Alternatively, the host system may determine when to initiate a wear level operation. In yet another embodiment, the user may have the option of initiating wear leveling, and in such an embodiment the memory controller or the host system may prompt the user about appropriate times to initiate a wear level operation.

If it is determined that a predetermined time period has not elapsed, then another determination may be made, e.g., at a slightly later time, to determine whether the predetermined time period has elapsed. Alternatively, if it is determined that the predetermined time period has elapsed, then in step 408, the hot counts or cycle counts for each physical location within the non-volatile memory or for each physical location within some range are obtained to limit seek times.

Once the hot counts are obtained, the hot count with the highest value indicating the most know wear is identified in step 412. Similarly, the hot count with the lowest value or lowest known wear is identified in step 416. Of course, approximations to the highest or lowest hot count (such as sufficiently high or sufficiently low) may be used, especially when a search algorithm is used.

In step 420, the one or more sectors stored in the physical location with the highest hot count is identified as a set of sectors "A," while the set of sectors stored in the physical location with the lowest hot count is identified as a set of sectors "B" in step 424. Once set of sectors "A" and set of sectors "B" are identified, a wear leveling process is performed in step 428 with respect to the physical locations with the highest and lowest hot counts. One suitable wear leveling process will be discussed below with respect to FIG. 5. After the wear leveling process is performed, the process of identifying sets of sectors that are to be subjected to a wear leveling process is completed.

FIG. 5 is a process flow diagram which illustrates an example of the steps associated with a wear leveling process, i.e., step 428 of the embodiment of FIG. 4. A wear leveling process 428 begins at step 504 in which set of sectors "A" is copied, as for example from the physical area with the highest hot count, into to a spare area, or an area within the non-volatile memory in which substantially no information is currently stored. Once set of sectors "A," is copied to the spare area, the physical location associated with the original set of sectors "A" is erased in step 508. In step 512, set of sectors "B" is coped into the physical location that was previously occupied by set of sectors "A". Once set of sectors "B" is copied, the physical location from which set of sectors "B" was copied is erased in step 516. After the physical location from which set of sectors "B" was copied is erased, set of sectors "A," which is stored in the spare area, is copied into the physical location that was previously occupied by set of sectors "B" in step 520. Then, in step 524, the spare area may be erased.

In order for a host or, more specifically, a host computer system which is accessing the non-volatile memory to be able to locate requested information within the non-volatile memory after wear leveling has occurred, mapping information which allows the memory controller to access the correct information is updated in step 528. The mapping information is updated such that the host LBAs used to access information stored in sets of sectors "A" and "B" access the new physical locations at which sets of sectors "A" and "B" are stored after the wear leveling process has occurred. Once the mapping information is updated, the process of performing a wear leveling procedure is completed. The mapping information may be stored in a table 214 in volatile RAM as in FIG. 2, and/or may be partially or completely contained in the non-volatile memory.

While a wear leveling process in a direct addressing context has been described as swapping two sets of sectors, such a wear leveling process may generally involve swapping any number of sets of sectors. For instance, in addition to swapping the set of sectors in the physical location associated with the highest hot count and the set of sectors in the physical location associated with the lowest hot count, the set of sectors in the physical location associated with the second highest hot count may also be swapped with the set of sectors in the physical location associated with the second lowest hot count. That is, several iterations of a wear leveling process may be performed either in parallel or serially. Further, in lieu of swapping the set of sectors in the physical location associated with the highest hot count with the set of sectors in the physical location associated with the lowest hot count during a wear leveling process, substantially any two sets of sectors may be swapped and they may be chosen randomly or based on some deterministic method.

C. Erase Pooling

As mentioned earlier, rather than incorporating a wear leveling process into a direct addressing scheme, a wear leveling process may instead be incorporated into an erase-pooling scheme. In an erase-pooling scheme, sectors are typically grouped into logical blocks that are non-statically associated with physical blocks. Logical blocks generally contain data for a range of host LBAs, but are stored to different physical locations in a flash memory system each time data is written or updated to those LBAs. Each physical block may contain a logical address field or some other identification of its physical contents. It is often convenient to keep such mapping information in a table in a volatile memory area that is conveniently accessed by the controller. In some embodiments the table is formed each time the flash memory system is powered-on to reduce the need to continuously search different logical blocks as different LBAs are accessed. The information necessary to construct such a table may also be stored in the non-volatile memory either with the actual user data or separate from it.

In one type of non-volatile memory system, the array is organized into zones. FIG. 6 is a diagrammatic representation of a non-volatile memory system which includes such zones. A non-volatile memory system 600 includes a non-volatile memory 604 which may be controlled by a memory controller 608. Memory controller 608 uses wear leveling processor 610 to perform a wear leveling process on non-volatile memory 204. Volatile memory 612, which may be accessed by memory controller 608, may contain, mapping information such as a logical to physical address map. Non-volatile memory 604 is divided into zones 614. The size of zones 614, as well as the number of zones 614, may vary depending both upon the size of non-volatile memory 604 and the requirements of non-volatile memory system 600. Zones 614 are generally divided into physical blocks 618 which, in one embodiment, may be grouped into metablocks as described earlier. Each block or metablock contains one or more groups (pages) 622 of one or more data sectors each. In a typical use of memory cell array zones, a specific non-overlapping range of host logical block addresses (LBAs) is mapped into each of the physical zones, and this mapping does not change. A zone may be defined in this manner to include blocks from two or more planes in a memory architecture utilizing multiple planes, each zone typically including the same number of blocks with the same relative physical addresses within the individual zones. A physical zone is defined as a block into which one of the discrete ranges of host LBAs is mapped, and, as such, can be logically reconfigured. Typically, the physical block addresses are selected to be contiguous for each zone but this is not a requirement.

In an erase-pooling scheme, wear leveling may occur either within a zone 614 or between zones 614. By way of example, within a zone 614, one group of sectors 622 may be moved between physical blocks 618 such that no single physical block 618 wears out much quicker than other physical blocks 618 within the same zone 614. Such an intra-zone erase-pooling scheme will be described below with reference to FIG. 7. When wear leveling occurs between two zones 614, the location of zones 614 may be moved to substantially prevent an individual zone 614 from being worn out much quicker than other zones 614, as will be discussed below with respect to FIGS. 8 and 9.

1. Intra-Zone Wear Leveling

During an intra-zone wear leveling process, logical blocks generally remain within a single zone and, as a result, zone boundaries which define the zone are effectively not moved. However, the logical associations with physical addresses within the zone are moved. FIG. 12a is a diagrammatic representation of a zone which includes physical blocks prior to an intra-zone wear leveling process taking place. Within a zone 1200, physical blocks 1202 may include logical contents, or contents associated with logical blocks 1206. Initially, physical block 1202a may include data pertaining to logical block 1206a, while physical block 1202b may effectively be an erased block, i.e., logical block 1206b may have substantially no contents. Intra-zone wear leveling may allow logical blocks 1206 to effectively be moved within zone 1200, as shown in FIG. 12b. As shown, once intra-zone wear leveling occurs, the contents of logical block 1206a have been moved into physical block 1202b, thereby causing physical block 1202a to be erased. Erased physical block 1202a effectively includes logical block 1206b which has substantially no contents. Hence, physical block 1202a is an erased block, while physical block 1206b is associated with logical block 1206a. It should be appreciated that data structures which contain mapping information associated with zone 1200 may be updated to hold the new location of data associated with logical block 1206a.

With reference to FIG. 7, the steps associated with an example general wear leveling process in an intra-zone erase-pooling context will be described. A process 700 begins at step 702, in which it is determined whether a wear leveling process is to be performed. While such a determination may be made using a variety of different methods or triggering events including those described earlier in the direct addressing wear leveling process, in the described embodiment such a determination is made through the use of random or pseudo-random numbers. In one embodiment, a zone may encompass an entire device or several devices.

It is determined in step 703 that wear leveling is to be performed. In the described embodiment, such a determination may include the use of a mask to reduce the probability of actually responding to the triggering event. For example, if a number containing some combinations of '1' and '0' is used as a mask to AND against the random number used for triggering, certain triggering events will be ignored and wear leveling will not be performed. The process flow then returns to step 702 in which another determination is made as to whether it is appropriate to perform wear leveling. Alternatively, if it is determined in step 703 that wear leveling is to be performed then a wear leveling procedure begins at step 704 in which a set of sectors "A" is copied into an erase pool that is located within the same zone as set of sectors "A." The erase pool is all the other erased blocks within the zone. Set of sectors "A" may generally be selected using substantially any method. For instance, set of sectors "A" may be chosen randomly or set of sectors "A" may be chosen deterministically.

After set of sectors "A" is copied into the erase pool, in step 708, the physical location which previously contained set of sectors "A" is erased. As such, the erased physical location or block effectively becomes part of the erase pool. Once the physical location which previously contained set of sectors "A" is erased, the process of performing a wear-leveling process as a part of an erase-pooling scheme is completed. It should be understood that any data structures which contain mapping information are generally updated to reflect the new location of set of sectors "A."

Intra-zone wear leveling generally enables wear to be spread substantially evenly within a given zone. However, when a given zone is programmed or erased much more often than other zones, the wear may be spread across different zones during a wear leveling process. Since logical zones typically contain fixed ranges of host LBAs, spreading the wear across different zones may involve moving the physical boundaries of the zones.

It should also be noted that the intra-zone wear leveling techniques described herein may be applied to a memory system having a single zone. Further, another example of single or intrazone wear leveling is described in section 4 below.

2. Zone Swapping

When the wear of physical blocks is such that substantially only one portion of a device is expected to be used heavily, a wear leveling process that involves swapping a heavily worn zone with a lighter worn zone may be advantageously used. A wear leveling process that uses zone swapping allows the physical locations of two zones to be swapped. Once a wear leveling process or operation is initiated, contents of blocks in each zone are copied into the other zone. Typically, since zones which contain a relatively large amount of data may take a substantial amount of time to swap, it should be appreciated that zone swapping may be performed in the background of standard activities involving a non-volatile memory device.

In order to substantially prevent data that is being moved from being accessed and, further, to substantially prevent a power down of a non-volatile memory device in the middle of a wear leveling operation from rendering the contents of the non-volatile memory device to be inaccessible, various data structures may be implemented. For example, data structures may indicate which stage a wear leveling process is at such that access to data may be substantially restricted depending upon the current stage of the wear leveling process. Various data structures may also enable a determination to be made as to when a swap operation is in progress, and contain information that may be used to continue an interrupted swap operation.

When two zones are selected to exchange locations during wear leveling, either randomly or deterministically, blocks from each zone may be copied to the other. During zone swapping, blocks may be alternately copied from the beginning of one zone into another such that the physical beginning of each zone during a zone swap contains blocks pertaining to the other zone. FIG. 13a is a diagrammatic representation of an example zone which includes physical blocks prior to a zone swapping wear leveling process. Physical zones 1300 include physical blocks 1310, 1320. Specifically, a zone "A" 1300a includes physical blocks 1310 while a zone "B" 1300b includes physical blocks 1320. In an initial state, a first logical zone which includes a logical block 1314a is substantially entirely within zone "A" 1300a, while a second logical zone which includes logical blocks 1314b–d is substantially entirely within zone "B" 1300b. As shown, physical block 1320c initially is an erased block.

During zone swapping, contents of logical blocks 1314 are moved between zones 1300. In a specific example, contents associated with logical block 1314b stored in a physical block 1320a may be moved into an available erased block within the same zone, such as physical block 1320c, to make room for a swap to begin. The physical block 1320a is then erased. Contents associated with logical block 1314a are then moved between zones from physical block 1310a into the erased physical block 1320a, and contents of logical block 1314c are moved between zones from the physical block 1320c into physical block 1310a. The physical block 1310c can then be erased and becomes available for a next round of data swaps between zones. FIG. 13b depicts zones 1300 of FIG. 13a after these initial steps involving the swapping of two logical blocks of data 1314a and 1314c between zones 1300a and 1300b. As shown, logical block 1314c is associated with zone "A" 1300a, while logical block 1314a is associated with zone "B" 1300b. After a zone swapping process, logical blocks 1314b, 1314d remain associated with zone "B" 1300b, although logical blocks 1314b, 1314d are contained within different physical blocks 1320.

In general, a swap boundary moves during the course of zone swapping. The swap boundary is a block in a given zone that delineates a boundary such that substantially all previous blocks that contain data have data that has been copied from another zone. Prior to the initial steps associated with zone swapping, shown in FIG. 13a, a swap boundary in zone "A" 1300a is physical block 1310a and a swap boundary in zone "B" 1300b is physical block 1320a. However, after the initial steps associated with zone swapping, as shown in FIG. 13b, a swap boundary in zone "A" 1300a is physical block 1310b, while a swap boundary in zone "B" 1300b is physical block 1320b.

Referring next to FIG. 8, the steps associated with an example method of performing wear leveling that includes zone swapping will be described. A process 800 begins at step 802, in which it is determined whether a wear leveling process is to be performed. As described above, while such a determination may be made using a variety of different methods, in the described embodiment, such a determination is made through the use of random or pseudo-random numbers. A determination is made in step 803 regarding whether, based on information that is studied in step 802, a wear leveling is to be performed. If it is determined that wear leveling is not to be performed, then process flow returns to step 802 in which another determination is made as to whether it is appropriate to perform wear leveling. Such a subsequent determination may be made after some amount of time.

Alternatively, if it is determined in step 803 that wear leveling is to be performed, then a wear leveling procedure begins at step 804 in which the contents of a physical block in a first zone, e.g., zone "B," at a swap boundary associated with zone "B" is copied into an erased block in zone "B." If the physical block at the zone boundary is already erased, this step is not necessary. The swap boundary, prior to the start of process 800, may be the first physical block of zone "B." Once the contents of the physical block are copied in step 804, the physical block at the swap boundary in zone "B" is erased in step 808. Erasing the physical block at the swap boundary in zone "B" effectively clears out a space at the beginning of zone "B." After the physical block at the swap boundary in zone "B" is erased, the contents of the physical block at a swap boundary in a second zone, e.g., zone "A," at the swap boundary are copied into the erased physical block at the swap boundary in zone "B" in step 812. That is, the contents of a "source block" are copied into a "destination block." Once the contents of the physical block at the swap boundary in zone "A" are copied, the physical block at the swap boundary in zone "A" is erased in step 816. Then, in step 820, mapping information is updated. In general, updating mapping information includes updating any data structures containing mapping information for blocks into which data has been copied, as well as for the erased state of the blocks that have been erased. Such mapping information may be stored in a non-volatile memory or in a volatile memory of a controller.

Upon updating the mapping information, the contents of the physical block at the swap boundary associated with zone "B" are copied in step 824 into the erased block at the swap boundary in zone "A." It should be appreciated that the swap boundary associated with zone "B" in step 824 is different from the swap boundary associated with zone "B" in step 804, as the swap boundary was effectively moved when contents associated with zone "A" were copied into the physical block at the original swap boundary associated with zone "B." Similarly, the swap boundary associated with zone "A" also effectively moves when contents associated with zone "B" are copied into a physical block that was previously a part of zone "A."

In step 828, the physical block at the swap boundary associated with zone "B" is erased, i.e., the source block from which contents were copied in step 824 is erased. Then, in step 832, mapping information updated to identify the physical locations at which specific information, e.g., copied contents, is located, and to identify the erased state associated with physical blocks which have been erased. A determination is then made in step 836 regarding whether zone "A" and zone "B" have been fully swapped. That is, it is determined whether all contents which were previously in zone "A" have been copied into zone "B," and whether all contents which were previously in zone "B" have been copied into zone "A."

When it is determined in step 836 that zone "A" and zone "B" have been fully swapped, then the process of performing wear leveling in the context of zone swapping is completed. Alternatively, if it is determined in step 836 that zone "A" and zone "B" have not been fully swapped, process flow returns to step 812 in which the contents of the physical block at the swap boundary of zone A are copied into the erased block at the swap boundary in zone "B." Non-volatile tables recording progress must be maintained during the wear leveling process such that the process can be continued after a loss of power, or if the wear leveling process is temporarily interrupted by a host access.

The rate at which zone swapping occurs may vary widely. In one embodiment, the rate at which contents of blocks that are swapped may be adjusted such that swapping occurs gradually, over a number of host operations. It should be appreciated that if a swap operation is performed in the background of host operations, then operations may occur while zones are in the process of being swapped. In such a case, the operation of a memory device is such that the non-contiguous physical location of the contents of the zone have little effect on the operation of the memory device. In other words, a zone temporarily encompasses two disjointed physical areas, but algorithms which govern zone management may operate in the same manner.

Zone swapping has been described in terms of exchanging the locations of two zones such that the logical blocks from one zone are copied into the other zone. In general, zone swapping may involve exchanging the locations of more than two zones. For example, the contents of a first zone may be copied into a second zone, the contents of the second zone may be copied into a third-zone, and the contents of the third zone may be copied into the first zone. The locations of substantially any number of zones may effectively be exchanged, although it should be understood that the number of zones may be determined based upon what is considered to be an acceptable performance penalty. That is, swapping the locations of more than two zones at a time may result in a performance penalty which may not be considered to be acceptable in some cases.

Similarly, the contents of more than one block may be swapped between zones during an overall zone swapping process. In other words, while a zone swapping process has been described as involving the swapping of the contents one block at a time between zones, it should be appreciated that the contents of two or more blocks may instead be swapped at a time between zones.

3. Zone Boundary Migration

Rather than fully swapping zones, e.g., a most worn zone with a least worn zone, during a zone swap wear leveling process, zones may instead be effectively migrated as a part of a zone migration wear leveling process. That is, the boundaries associated with zones may be shifted such that a physical block or physical blocks which were originally a part of one zone become a part of another zone. By shifting zone boundaries, physical blocks associated with physical zones that were previously programmed and erased repeatedly may become physical blocks that are programmed and erased less often. Therefore, the wear of physical blocks in a memory device may be spread more evenly across the device. Spreading the wear of physical blocks across the device is particularly useful when several areas of the card are expected to be used relatively heavily. If a period of movement is sufficiently short, a minimum amount of wear leveling may be substantially guaranteed.

A wear leveling process which uses zone boundary migration, or effectively moves logical zone boundaries, allows physical locations of logical zones to be gradually changed. Zone boundaries may be located by reading sectors from blocks at intervals substantially equal to the size of a zone. A header associated with each block may show a zone field. Once one block from a zone has been located, boundaries may be found by reading at least the headers of contiguous blocks, in each direction until a block from each of the adjacent zones is found. Alternatively, substantially all mapping information may be stored in tables within a non-volatile memory. When the zone boundaries of one zone are known and a fixed zone size is known, the zone boundaries associated with other zones may generally be determined without reading sectors from blocks at intervals substantially equal to the fixed size of the zones. That is, if the size and the order of zones is known, reading the contents of one block, which has a header that contains a logical block number and zone information associated with a logical zone, enables zone boundaries to be located. In general, the header of a block may include an absolute logical block number which enables the location of the block to be determined, or a relative logical block number which may be used with zone information, to facilitate the physical location of zones to be determined.

With reference to FIG. 9, the steps associated with an example method of wear leveling using a zone boundary migration will be described. A process 900 begins at step 902, in which it is determined whether a wear leveling process is to be performed. While such a determination may be made using a variety of different methods, e.g., deterministic methods, in the described embodiment, such a determination is made through the use of random or pseudo-random numbers.

It is determined in step 903 whether a wear leveling is to be performed. If it is determined that wear leveling is not to be performed, then the process flow returns to step 902 in which another determination is made as to whether it is appropriate to perform wear leveling. Alternatively, if it is determined in step 903 that wear leveling is to be performed, a wear leveling procedure effectively begins at step 904 in which a determination is made regarding whether the first physical block located in logical zone "X" is erased. That is, it is determined whether the first physical block at the beginning of logical zone "X," i.e., at a lower zone boundary of zone "X," is erased.

If it is determined that the first physical block in zone "X" is not erased, then the indication is that the first physical block in zone "X" contains information. Accordingly, process flow moves to step 908 in which the contents of the physical block at the beginning of logical zone "X" are copied into substantially any available block within zone "X." Once the contents of the physical block are copied into the erased block in zone "X," the physical block at the beginning of zone "X" is erased in step 912.

After the physical block at the beginning of zone "X" is erased in step 912, the contents of the first physical block at the beginning of logical zone "X−1" are copied into the newly erased block in zone "X." By way of example, with reference to FIG. 6, after the physical block at the beginning of zone "0" 614a is erased, the contents of the first physical block at the beginning of zone "N" 614c are copied into the erased block. As a result, logical zone "X" and logical zone "X−1" are effectively each shifted by one physical block. The mappings of LBAs to physical blocks in specific zones are then updated in step 920 to indicate that the contents which were in the first physical block of zone "X" in step 908 have been moved, and that the contents of the first physical block at the beginning of zone "X−1" have also been moved.

A determination is made in step 924, once the mapping of physical locations is updated, regarding whether there are more zones to be shifted. If it is determined that there are no more zones to be shifted, then the indication is that all zones have been shifted by a physical block, and the process of shifting zones such that the zone boundaries essentially migrate is completed. Alternatively, if it is determined that there are additional zones to shift, then a new zone "X" and a new zone "X−1" are identified in step 928. Process flow then returns to step 904 in which it is determined if the first physical block in zone "X" is erased.

Returning to step 904, if it is determined that the first physical block in zone "X" is erased, the indication is that the first physical block in zone "X" is available to be copied into. As such, process flow proceeds from step 904 to step 916 in which the contents of the first physical block at the beginning of zone "X−1" are copied into the first physical block in zone "X."

FIG. 10 is a diagrammatic representation of the initial state of a memory device and the state of the memory device after the example zone boundary migration process or processes, e.g., process 900 of FIG. 9. A device 1000', is initially divided into any number of zones 1004', e.g., five zones. After one or more cycles or iterations of a zone boundary migration is completed, e.g., after each zone is effectively shifted by at least one physical block, zone boundaries have migrated such that zones 1004" in device 1000" have essentially moved by one or more physical blocks. As shown, a zone boundary migration causes zone "4" 1004e' to shift into non-contiguous physical blocks to form zone "4" 1004e" and 1004e'''.

Generally, a zone boundary migration process may be repeated such that no physical blocks which were initially in a given zone remain in that zone after multiple iterations of a zone boundary migration process. That is, the physical locations of zones may be gradually moved, one physical block at a time, throughout an entire memory device. Zone boundaries may also be migrated such that at some point after multiple iterations of a zone boundary migration process, the physical locations of zones are the same as the physical locations of zones before a zone boundary migration process was initiated.

The amount of time between successive zone boundary migration processes may vary depending upon the requirements of an overall system. In one embodiment, the rate at which zones are shifted using a zone boundary migration process may be adjusted such that by the end of the life of a memory device, a given zone will have traversed substantially the entire device and no more. In another embodiment, the rate may be as low as possible to substantially minimize the performance penalty associated with wear leveling, and to effectively minimize any additional wear due to the zone boundary migration process itself. It should be understood, however, that the rate at which zones are shifted may be adjusted due to performance considerations, or the rate may be set arbitrarily.

With reference to FIGS. 11a–c, an example of movement of a zone boundary during a zone boundary migration process will be described. As shown in FIG. 11a, a physical device 1100 is initially divided into any number of logical zones 1104. In the described embodiment, device 1100 includes three logical zones, although the number of zones 1104 may vary widely. Each of the logical zones 1104 are typically formed of a plurality of blocks having contiguous physical addresses separated by zone boundaries except for extra blocks that may be interspersed throughout the zones due to allocation of some blocks to store system information, allocation to an erase pool, and the presence of defective blocks. Each logical zone 1104 is defined to include certain identified physical blocks 1106. The full range of host data logical block addresses (LBAs) is typically divided into a number of segments of contiguous LBAs equal to the number of physical memory zones, each LBA segment being mapped into a different one the logical zones 1104.

FIG. 11b is a diagrammatic representation of device 1100 of FIG. 11a during initial zone boundary migration steps in accordance with the embodiment being described. Initially, the contents of block 1106a, a first physical block of zone 1104a that is located at swap boundary 1108c, are moved into an erased block 1106c, as step (1) indicated by the arrow 1124. If there is no available erased block within zone 1104a, then a consolidation process is first performed on the entire zone to compact pages of valid data in fewer blocks and thus free up one or more blocks that are then erased. In the unlikely event that this fails to produce an erased block, then one used block within the zone must be moved to another zone, or the zone boundary extended to include additional blocks from which an erased block can be found. As step (2), contents of block 1106e, a first physical block associated with zone 1104c and is located at swap boundary 1108b, are moved into block 1106a as indicated by arrow 1126, and the first physical block 1106e of zone 1104c is then erased.

As step (3), the contents of block 1106d, a first physical block of zone 1104b that is located at swap boundary 1108a, may be moved into the first physical block associated with zone 1104c, thereby leaving the first physical block of zone 1104d effectively erased, as indicated by arrow 1128. Once the contents of block 1106d associated with the physical block at swap boundary 1108a are moved, step (4) moves the contents of block 1106b into the first physical block 1106d of zone 1104b, as indicated by arrow 1130.

As shown in FIG. 11c, once contents of blocks 1106 have been moved, or copied and erased, logical zone boundaries are effectively shifted. The physical zone boundaries of each of logical zones 1104 have effectively been shifted by one physical block. For instance, logical zone boundaries 1108c and 1108a have shifted or migrated such that zone 1104a is shifted. Likewise, zones 1104b, 1104c have each shifted as well due to the migration of logical zone boundaries 1108a, 1108b and 1108c. This shifting or migration is accomplished by moving data between the blocks, as described, plus remapping the range of LBAs for each zone into a set of blocks including the block added to the zone but omitting the block removed from the zone. Although zone boundary migration has been described as moving the boundary of a zone by one physical block at a time, a zone boundary may be moved by more than one block at a time but only a small proportion of the number of blocks in a zone, such as less than 10, 5 or even 2 per-cent. The goal is to perform the boundary migration a small number of blocks at a time during periods when the host is not requesting that data be programmed or read, and when the controller is not otherwise performing higher priority operations. Wear leveling is thus performed without adversely affecting the overall performance of the memory.

In addition, with regards to zone boundary migration, if erased blocks associated with a memory device are maintained in a separate pool, e.g., are not maintained in individual zones, the pool of erased blocks may be treated as a zone during zone boundary migration.

4. Single Zone Wear Leveling

A wear leveling process similar to that described with respect to FIGS. 9–11c can also be applied in a memory system with a single zone. The shifting logical boundaries described above are physical pointers that identify the blocks immediately adjacent them for wear leveling processing. With a single zone, such a pointer cycles through the memory cell blocks in some deterministic manner, such as by incrementing through the blocks one at a time in the order of their physical addresses. When the criteria are met for performing a wear leveling operation, a process is initiated with the block that is currently pointed to. If it is not erased, its contents are copied into a block within the zone that is in an erased state, namely a block within an erase pool. The address tables are then updated to reflect this change of location for the copied data and the original block is erased. The pointer then moves to the next block in order to await initiation of the next wear leveling cycle, at which time the process is repeated with that next block. If the pointed block is initially in an erased state, the pointer merely moves on to the next block without wear leveling taking place. Once the pointer has stepped through all the blocks in the zone before the end of life of the memory system, it can then repeat its cycle.

It will be noted that this wear leveling process is performed without reference to the number of times that the individual blocks have been erased and reprogrammed (hot counts). A threshold condition for performing the wear leveling operation can be the programming of a predetermined number of blocks within the erase pool since the last wear leveling operation. That is, the wear leveling operations are performed on the pointed blocks at intervals of a predetermined number of block programming operations. And instead of single blocks being handled at one time, two or more blocks may alternatively be included in the individual wear leveling operations.

The processes described in the forgoing paragraphs of this section can also be applied to a multi-zone system where wear leveling takes place within each zone without changing the zone boundaries.

5. Hot Counts

It should be appreciated that instead of maintaining hot counts on a physical block basis, hot counts may be maintained with respect to logical blocks. Maintaining hot counts for logical blocks, e.g., maintaining relative hot counts, enables the most recently moved and least recently moved logical blocks to be tracked. In one embodiment, logical blocks may effectively be grouped into sets based upon how recently the blocks were moved. All blocks within a zone may be given an initial relative hot count value, and each time a block is moved, the relative hot count may be updated to the value of the most recently moved set or group, which is generally one above the base value. Once a certain number of blocks are in the most recently moved group, the most recently moved group value may be incremented, and any blocks moved subsequently may be updated to the new group value. As a result, distinct groups or bins of logical or physical blocks may be created with a relatively clear distinction between most recently moved and least recently moved blocks. In general, the relative hot count value of a block is allowed to roll over to permit the use of a relatively small number fields. The values may be managed such that there is substantially always a large set of unused values between the most recently and least recently used values to allow for a distinction to be made between a low value that indicates a least recently moved block and a low value that indicates a most recently moved block with a recently rolled over numerical field.

When relative hot counts are implemented, substantially all blocks may start at a base value of '0' when there are eight possible values, in a specific example, e.g., values of '0' through '7.' Seven out of the eight values may be used while one value is reserved to provide a gap between the value representing the blocks most recently programmed from the value identifying the blocks containing the oldest data. In this example, blocks that are written receive a new value of '1' to indicate that they are the most recently reprogrammed. Once a certain predefined number of blocks have been updated to the new value of '1' blocks being reprogrammed may received a new value of '2.' A value of '3' may eventually be assigned to newly reprogrammed blocks once the same or a different predefined number of blocks have a value of '2.' This continues, assigning the next bin number to blocks being reprogrammed after each predefined number of blocks are reprogrammed. At some point, the count will roll over such that the least recently used blocks have a value of '2,' the most recently moved blocks have a value of '0,' and the value '1' provides a gap between the two so that the values of the blocks with the oldest and newest data are clearly identified.

Eventually, all the blocks in the oldest bin will be rewritten. If not through host writes, scrubbing, or some other mechanism, then by wear leveling. In the above example, bin '2' containing the oldest blocks will then be empty, and that value can serve as the gap, while bin '1' can be used to identify the most recently written blocks. A larger gap than one between used ranges of values (bins) may result from a case in which blocks from the moderately recently moved group are updated by a host or some other mechanism faster than a wear leveling operation moves the least recently moved blocks. Absolute hot counts may be available in which case the system may preferably use logical or physical block usage information to drive decisions.

In an intra-zone wear leveling scheme, a block may be selected to be moved into an erased block. When relative logical hot counts are implemented, the intra-zone wear leveling scheme may select a logical block from a least recently moved group, or from a group with the lowest value. Once the selected block is moved, the selected block receives a value of a most recently moved group. Generally, the logical blocks most frequently accessed by a host will have a value that indicates that the blocks have most recently been moved and, hence, may not be selected by a wear leveling system to be moved. At the same time, logical blocks least frequently accessed by the host will tend to have a lower value that eventually indicates that the blocks have been least recently moved. The logical blocks with a least recently moved value typically will not have been accessed for some time and, as a result, other blocks will have reached a higher level of wear in the same period. Once the less frequently accessed logical blocks are moved into erased physical blocks, the less frequently accessed logical blocks will typically remain in their current physical locations until moved again by wear leveling. That is, a physical block in which a less frequently accessed logical block resides generally will not be accessed, while the previously occupied physical block may be transferred to an erase pool for future use and, therefore, receive more wear.

An erase pool of erased physical blocks has generally been described as being included within a zone. In one embodiment, a pool of erased blocks may be maintained separately from zones within a memory device. Such erased blocks may be allocated on an as-needed basis from a physically contiguous group of blocks on the memory device.

D. Summary

While the various aspects of the present invention have been described generally in relation to a set of sectors, the number of sectors in a set of sectors may be any appropriate number greater or equal to one. However, the most efficient number of sectors within a set of sectors is typically dependent upon the number of sectors within a unit of erase, and the number of units of erase within the physical memory array.

The various wear leveling processes have been described as being suitable for implementation with respect to non-volatile memory systems such as flash memory cards. In general, wear leveling processes may be applied to substantially any suitable non-volatile memory system. Suitable non-volatile memory systems include, but are not limited to, embedded memory and memory drives. In one embodiment, such non-volatile memory systems may be removably coupled to host systems, and in another embodiment the non-volatile memory system may be an embedded system within a host system. Additionally, wear leveling processes may be applied to various volatile memory systems.

While non-volatile memory systems have been described as including memory controllers, it should be understood that wear leveling processes may be applied to non-volatile memory systems that do not include memory controllers. Suitable memory systems that use controllers include, but are not limited to, PC cards, CompactFlash cards, MultiMedia cards, and Secure Digital cards. Memory systems that may use the wear leveling processes described above and do not use controllers associated with the memory systems may use controllers associated with a host, e.g., a host computer system, to implement wear leveling, such as SmartMedia cards and MemoryStick cards. In other words, a host may directly address and manage memory in which wear leveling is to occur. Additionally, a primary processor resident on the host system may act as the memory controller for the memory system, whether the memory system contains a controller or not.

Although only a few embodiments of the present invention have been described, it should be understood that the present invention may be embodied in many other specific forms without departing from the spirit or the scope of the present invention. By way of example, while wear leveling in the context of direct addressing and erase pooling has been described as substantially automatic processes, it should be appreciated that wear leveling may be a user-driven process. In other words, a user may determine when to initiate a wear leveling process by issuing a command through a host interface.

In general, the steps associated with the various processes and methods of wear leveling may vary widely. Steps may generally be added, removed, altered, and reordered without departing from the spirit of the scope of the present invention. By way of example, it may not be necessary to update mapping information when zone boundaries are migrated or zones are swapped. If individual physical blocks have some indicator as to which logical zone the physical blocks belong, then it may not be necessary to effectively log the progress of a swap or a migration. Steps may also be added to the various method and processes to accommodate the updating of data structures or mappings which facilitate the location of various logical blocks without departing from the spirit or the scope of the present invention. Furthermore, a specific implementation may incorporate a plurality of embodiments.

Therefore, the present examples are to be considered as illustrative and not restrictive, and the invention is not to be limited to the details given herein, but may be modified within the scope of the appended claims.

The invention claimed is:

1. In a memory system including a plurality of units of erasable and re-programmable non-volatile memory cells having contiguous physical addresses organized into zones with address boundaries therebetween and wherein a distinct range of logical addresses are mapped into each of the zones, a method of operation that comprises:
   reassigning the boundary addresses to delete at least one unit from each of the zones and to add said at least one unit to an adjacent zone without changing the number of units in the individual zones,
   thereafter accessing the zones for programming data to or reading data from the reassigned memory cell units therein according to logical addresses of the data, and
   repetitively reassigning the boundary addresses and accessing the zones at least until the plurality of memory cell units have all been moved from their zones to adjacent zones, thereby to spread out usage of the units accessed through the logical addresses.

2. The method of claim 1, wherein reassigning the boundary addresses includes deleting a number of units from each of the zones less than ten percent of the units within the zone and adding said number of units to an adjacent zone.

3. The method of claim 1, wherein the zones are formed with portions of their memory cell units in an individual plurality of memory planes, and wherein reassigning the boundary addresses includes deleting at least one unit from each portion of the zones in each of the memory planes and adding said at least one unit to an adjacent portion of another zone within the same plane.

4. The method of claim 1, wherein the memory cell units individually include a plurality of simultaneously erasable memory cells.

5. The method of claim 4, wherein the memory cell units individually include a plurality of pages that are individually programmable with data.

6. The method of claim 1, wherein reassigning the boundary addresses includes copying any data stored in said at least one unit from each of the zones into the added unit of the adjacent zone.

7. A method of operating a system of erasable and re-programmable non-volatile memory cells that are physically organized into units of a minimum number of memory cells that are simultaneously erasable, comprising:

directing host access requests to program or read data within one of three or more non-overlapping ranges of logical memory addresses into a unique one of a corresponding number of logical groups of memory cell erase units, mapping access requests from the logical groups into distinct physical groups of a plurality of erase units, and between data programming or reading operations caused by host access requests, repetitively re-mapping the logical groups into the physical groups by removing a portion of the individual physical groups including at least one erase unit at a time and adding the removed erase units to adjacent ones of the physical groups in a manner that maintains a uniform number of erase units in the individual physical groups, whereby usage of the erase units over the system is leveled out over time.

8. A method of operating an array of flash memory cells organized into a plurality of blocks of a minimum number of simultaneously erasable memory cells within a plurality of planes, comprising:

defining a plurality of zones to individually include a portion of the plurality of blocks from each of a plurality of planes, mapping a different portion of a range of logical addresses to each of the zones, and repetitively re-defining the individual zones by removing at least one block therefrom in each plane and adding the removed blocks to others of the zones in their same planes in a manner to maintain the plurality of zones with the specified plurality of blocks in each of the plurality of planes, whereby usage of the blocks at various of the ranges of logical addresses is spread out in time over the array.

9. In a memory system including a plurality of zones individually including a plurality of units of re-programmable non-volatile memory cells that are erasable together, wherein a distinct range of logical addresses received by the memory system are mapped into the individual zones, a method of operation that comprises:

receiving a logical address within the distinct logical address range of one of the zones, and converting the received logical address into a physical address of at least one of the plurality of memory cell erase units within said one zone that tends to even out a number of usage cycles of erasing and re-programming the erase units within said one zone.

10. The method of claim 9, wherein converting the logical address into the physical address includes reference to a table of corresponding logical and physical addresses, and which additionally comprises changing the correspondence between logical and physical erase unit addresses in order to tend to even out the frequency of use of the erase units within said one zone.

11. The method of claim 10, wherein changing the correspondence between logical and physical erase unit addresses includes swapping physical addresses of the erase units within said one zone that have a highest and a lowest accumulated number of usage cycles.

12. The method of claim 10, wherein the memory cells have a target endurance limit of a maximum number of usage cycles that the memory cells are to experience, and wherein changing the correspondence between logical and physical erase unit addresses occurs prior to the number of usage cycles of an erase unit whose corresponding address is changed reaching said target maximum number.

13. In a memory system including a plurality of zones individually including a plurality of units of re-programmable non-volatile memory cells that are erasable together, wherein a distinct range of logical addresses received by the memory system are mapped into the individual zones, a method of operation that comprises:

exchanging data stored in a first of the plurality of zones with data stored in a second of the plurality of zones, and thereafter converting addresses accessing the memory system within one of the first and second zones to addresses accessing the other of the first and second zones.

14. The method of claim 13, wherein exchanging data includes:

moving data from a first erase unit in the second zone having a physical address adjacent a border of physical addresses of the second zone into a second erase unit in the second zone that is erased, and moving data from an erase unit of the first zone having a physical address adjacent a border of physical addresses of the first zone into said first unit.

15. A method of operating a system of erasable and re-programmable non-volatile memory cells organized into a plurality of physical blocks of a minimum number of memory cells that are simultaneously erasable and wherein incoming data are programmed into those of the plurality of physical blocks maintained as an erased block pool, comprising:

identifying at least one of the plurality of physical blocks at a time other than those in the erased block pool for a wear leveling exchange by cycling through addresses of the plurality of physical blocks in a predefined order, and exchanging the identified at least one of the plurality of physical blocks with a corresponding number of at least one of the plurality of physical blocks within the erased block pool.

16. The method of claim 15, wherein exchanging the identified blocks includes copying data from the identified at least one of the plurality of physical blocks into said corresponding number of at least one of the physical blocks within the erased block pool, and changing mapping of at least one logical block address from said at least one of the plurality of physical blocks to said corresponding number of at least one of the physical blocks within the erased block pool.

17. The method of claim 16, additionally comprising, after copying the data, of erasing the identified at least one of the plurality of physical blocks and placing the erased at least one block into the erase pool.

18. The method of claim 15, wherein identifying at least one of the plurality of physical blocks for a wear leveling exchange is accomplished without reference to a number of erase cycles experienced by the individual physical blocks.

19. The method of claim 15, wherein identifying at least one of the plurality of physical blocks at a time includes doing so at intervals of a predetermined number of the plurality of physical blocks within the erased block pool being programmed with data.

20. A method of operating a system of erasable and re-programmable non-volatile memory cells organized into a plurality of physical blocks of a minimum number of memory cells that are simultaneously erasable, comprising:
mapping a range of logical block addresses into addresses of a proportion of the plurality of physical blocks that leaves an additional number of physical blocks providing an erased block pool,
in response to requests to store data in at least one of the range of logical block addresses, converting said at least one logical block address into an address of at least one physical block residing in the erased block pool and then writing the data into said at least one physical block of the erased block pool,
identifying one of the plurality of physical blocks for a wear leveling exchange,
after a given number of memory programming operations, exchanging the identified one of the plurality of physical blocks with one of the number of physical blocks residing in the erased block pool, and
repeating identifying and exchanging with others of the plurality of physical blocks in a predefined order.

21. The method of claim 20, wherein identifying physical blocks includes determining whether the identified physical block is within the erase block pool or subject to a pending programming operation, in either case the identified physical block is not exchanged.

22. The method of claim 20, wherein exchanging the identified blocks includes copying data from the identified one of the plurality of physical blocks into said corresponding number of physical blocks within the erased block pool, and changing mapping of at least one logical block address from said at least one of the plurality of physical blocks to said corresponding number of one or more physical blocks within the erased block pool.

23. The method of claim 22, additionally comprising, after copying the data, of erasing the identified one of the plurality of physical blocks and placing the erased at least one block into the erase pool.

24. A method of managing a plurality of groups of erasable and electrically programmable memory cells, comprising:
upon programming data into ones of the plurality of groups of cells, associating and storing one of a plurality of indications for the individual programmed groups of cells that is selected by incrementing the indication after a predefined number of instances of programming of ones of the plurality of groups have occurred, the associated and stored indications being repetitively incremented through the plurality of indications in a predefined order, wherein the stored indications provide relative times of programming of the corresponding groups of cells, and
performing an operation on the groups of memory cells according to their relative numbers assigned.

25. The method of claim 24, wherein associating and storing the indications include associating a first one of the plurality of indications to a first two or more groups of cells being programmed until said first one of the plurality of indications has been assigned to a predefined number of programmed groups of cells, thereafter assigning a second one of the plurality of indications to a second two or more groups of cells being programmed until the second one of the plurality of indications has been assigned to the predefined number of groups of cells, and thereafter associating a third one of the plurality of indications to a third two or more groups of cells being programmed until the third of the plurality of indications has been associated with the predefined number of groups of cells.

26. The method of claim 24, wherein the plurality of indications include a plurality of sequential numbers.

27. The method of claim 24, wherein the operation performed on the groups of memory cells includes selecting those of the groups of cells for programming according to the relative indications applied to the groups in a manner that tend to even out a number of cycles of programming experienced by the groups.

28. The method of claim 24 wherein the plurality of indications have a cyclical order.

* * * * *